(12) United States Patent
Hao

(10) Patent No.: US 8,840,754 B2
(45) Date of Patent: Sep. 23, 2014

(54) POLAR REGIONS FOR ELECTROSTATIC DE-CHUCKING WITH LIFT PINS

(75) Inventor: Jennifer Fangli Hao, Cupertino, CA (US)

(73) Assignee: Lam Research Corporation, Fremont, CA (US)

(*) Notice: Subject to any disclaimer, the term of this patent is extended or adjusted under 35 U.S.C. 154(b) by 573 days.

(21) Appl. No.: 12/970,914

(22) Filed: Dec. 16, 2010

(65) Prior Publication Data

US 2012/0070996 A1 Mar. 22, 2012

Related U.S. Application Data

(60) Provisional application No. 61/384,231, filed on Sep. 17, 2010.

(51) Int. Cl.
*H01L 21/306* (2006.01)
*H01L 21/683* (2006.01)
*H01L 21/30* (2006.01)
*H01L 21/687* (2006.01)

(52) U.S. Cl.
CPC ...... *H01L 21/6831* (2013.01); *H01L 21/68742* (2013.01)
USPC 156/345.51; 118/500; 361/234; 257/E21.211; 257/E21.218

(58) Field of Classification Search
USPC ......... 361/234; 156/345.51; 118/500, 345.51; 257/E21.211, E21.218
See application file for complete search history.

(56) References Cited

U.S. PATENT DOCUMENTS

| 5,459,632 | A | 10/1995 | Birang et al. |
| 5,557,215 | A | 9/1996 | Saeki et al. |
| 5,684,669 | A * | 11/1997 | Collins et al. ................. 361/234 |
| 6,215,640 | B1 | 4/2001 | Hausmann |
| 6,898,064 | B1 * | 5/2005 | Berman et al. ................ 361/234 |
| 7,436,645 | B2 | 10/2008 | Holland et al. |
| 2008/0220622 | A1 | 9/2008 | Goodman et al. |
| 2012/0070996 | A1 * | 3/2012 | Hao ............................ 438/710 |

OTHER PUBLICATIONS

International Search Report and Written Opinion for PCT/US2011/051825, mailed on Jan. 17, 2012.

* cited by examiner

*Primary Examiner* — Sylvia R MacArthur
(74) *Attorney, Agent, or Firm* — Martine Penilla Group, LLP

(57) ABSTRACT

An apparatus for electrostatic chucking and dechucking of a semiconductor wafer includes an electrostatic chuck with a number of zones. Each zone includes one or more polar regions around a lift pin that contacts a bottom surface of the semiconductor wafer. The apparatus also includes one or more controllers that control the lift pins and one or more controllers that control the polar regions. The controller for the lift pins receives data from one or more sensors and uses the data to adjust the upward force of the lift pins. Likewise, the controller for the polar regions receives data from the sensors and uses the data to adjust the voltage in the polar regions.

20 Claims, 21 Drawing Sheets

POLAR REGIONS FOR ELECTROSTATIC DE-CHUCKING WITH LIFT PINS

PRIORITY CLAIM

This application claims priority from U.S. Provisional Patent Application No. 61/384,231 filed on Sep. 17, 2010 and entitled "Polar Regions for Electrostatic De-chucking With Lift Pins," which is incorporated herein by reference in its entirety for all purposes.

BACKGROUND

The designs for many semiconductor processing facilities involve a process chamber where a semiconductor wafer is processed (e.g., etched or subjected to deposition) by a plasma. The designs often include an electrostatic chuck (or ESC) to clamp the semiconductor wafer during such processing, through the use of an electrical pole pattern in the electrostatic chuck. The design of the electrical pole pattern can have an effect on the uniformity of the clamping.

Once the processing is complete, the semiconductor wafer is separated or de-chucked from the electrostatic chuck so that it can be removed from the process chamber. However, residual electrostatic charge might remain, making efficient separation difficult. Here again, the design of the electrical pole pattern can have an effect on the efficiency of such separation.

To address the problem of residual electrostatic charge and to assist with process automation, among other things, some designs for semiconductor processing facilities include lift pins that raise the semiconductor wafer off the electrostatic chuck into a position where the semiconductor wafer can be retrieved with a robotic arm. Of course, if the force generated by such lift pins is not monitored and controlled, the lift pins can damage or even break the semiconductor wafer. In this regard, co-owned U.S. Pat. No. 6,646,857 (hereby incorporated herein by reference) describes, among other things, a group of lift pins that are connected in a yoke arrangement and that are coupled to a feedback loop.

SUMMARY

In an example embodiment, an apparatus for electrostatic chucking and dechucking of a semiconductor wafer includes an electrostatic chuck with a number of zones. Each zone includes one or more polar regions around a lift pin that contacts a bottom surface of the semiconductor wafer. The apparatus also includes one or more controllers that control the lift pins and one or more controllers that control the polar region. In an example embodiment, the controller for the lift pins receives data from one or more sensors and uses the data to adjust the upward force of the lift pins. Likewise, in an example embodiment, the controller for the polar regions receives data from the sensors and uses the data to adjust the voltage in the polar regions.

In another example embodiment, an automated method for processing semiconductor wafers is performed by a process controller. The process controller begins by placing a semiconductor wafer on an electrostatic chuck in a process chamber. The electrostatic chuck includes a number of zones and each zone includes one or more polar regions around a lift pin moved by pneumatic pressure. The process controller then clamps the semiconductor wafer to the electrostatic chuck by applying a voltage to the one or more polar regions. The process controller processes the semiconductor and terminates the processing operation. And the process controller applies another voltage to one or more polar regions of one or more zones to initiate dechucking. The process controller then begins lifting the semiconductor wafer off the electrostatic chuck with the lift pins. The process controller uses a sensor to measure the electrostatic force between the semiconductor and the electrostatic chuck and adjusts the upward force to avoid damage to the semiconductor wafer.

In another example embodiment, an apparatus for processing a semiconductor wafer includes a process chamber with a top electrode coupled to an RF power source and an electrostatic chuck coupled to an RF power source. The electrostatic chuck includes a number of zones and each zone includes one or more polar regions around a lift pin that contacts a bottom surface of the semiconductor wafer.

The advantages of the present invention will become apparent from the following detailed description, which taken in conjunction with the accompanying drawings, illustrates by way of example the principles of the invention.

DETAILED DESCRIPTION

In the following description, numerous specific details are set forth in order to provide a thorough understanding of the example embodiments. However, it will be apparent to one skilled in the art that the example embodiments may be practiced without some of these specific details. In other instances, implementation details and process operations have not been described in detail, if already well known.

Figure 1:
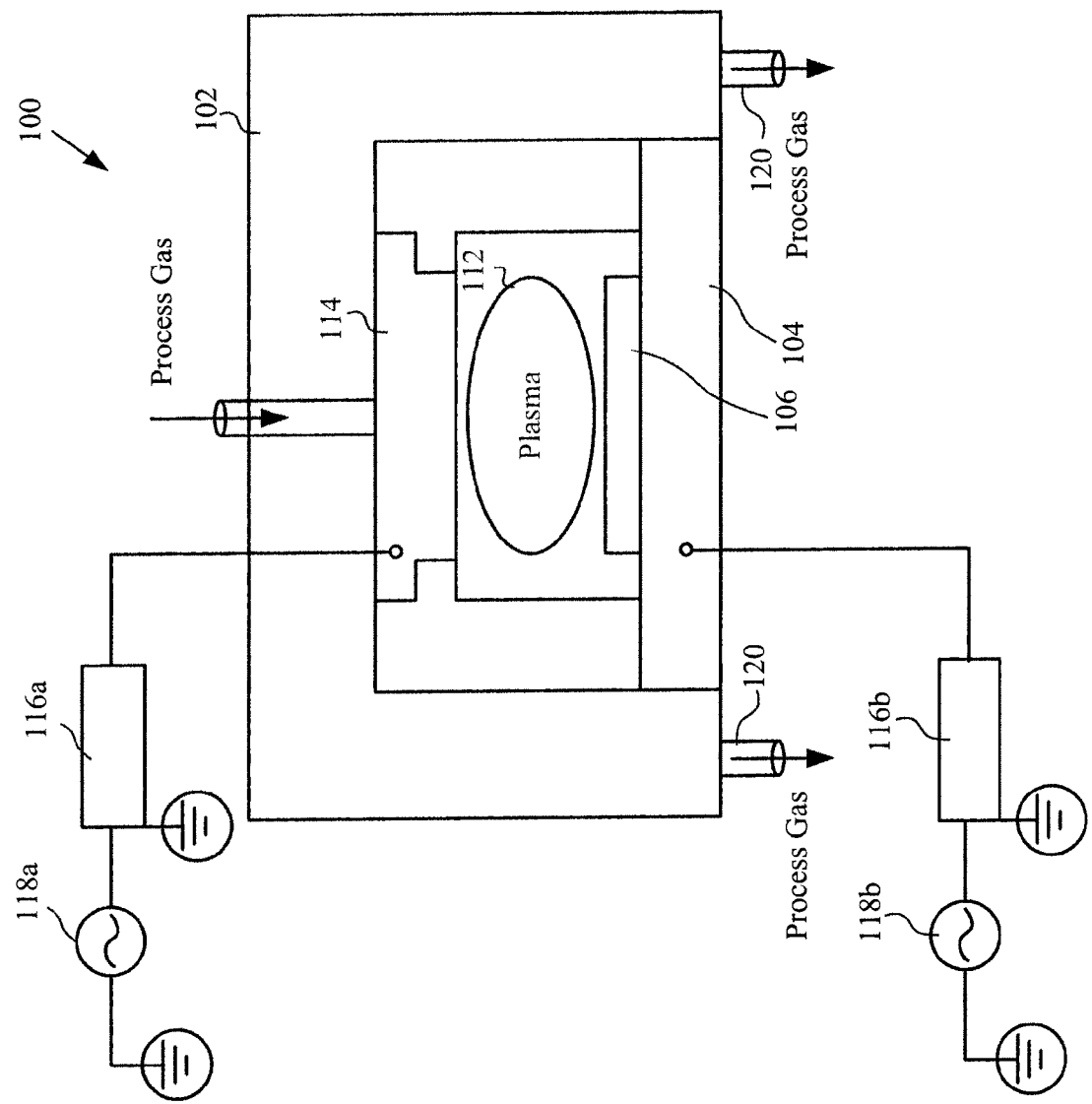
FIG. 1 is a schematic diagram showing a system for processing a semiconductor wafer in a process chamber, in accordance with an example embodiment.

FIG. 1 is a schematic diagram showing a system for processing a semiconductor wafer in a process chamber, in accordance with an example embodiment. As depicted in that figure, a system 100 includes a process chamber 102 that is used for processing semiconductor wafers, e.g., through etching or deposition operations. Process chamber 102 includes an electrostatic chuck 104 which is designed to clamp or grip a semiconductor wafer 106. The process chamber 102 includes a top electrode 114 which is designed to receive processing gases that are distributed into the plasma region 112 during processing.

The plasma region 112 is defined between the surface of the top electrode 114 and the surface of the semiconductor wafer 106. The top electrode 114 is connected to a match box 116a and to an RF (radio frequency) power source 118a. The electrostatic chuck 104 is connected to a match box 116b and an RF power source 118b. The process chamber 102 is provided with outlets 120 which pump out excess gases from within the process chamber 102 during processing. When in operation, the RF power supply 118a biases the top electrode 114 and operates at frequencies of approximately 27 MHz, in some embodiments. The RF power source 118a is primarily responsible for generating most of the plasma density within the plasma region 112, while the RF power source 118b is primarily responsible for generating a bias voltage within the plasma region 112. The RF power source 118b generally operates at lower frequencies of approximately 2 MHz.

It will be appreciated that the system shows a process chamber for a capacitively-coupled plasma. However, the inventions described below will work with other process chambers, including, for example, a process chamber for a transformer-coupled plasma (TCP), which might not have a top electrode. That is to say, FIG. 1 is intended to be illustrative, rather than limiting.

Figure 2:
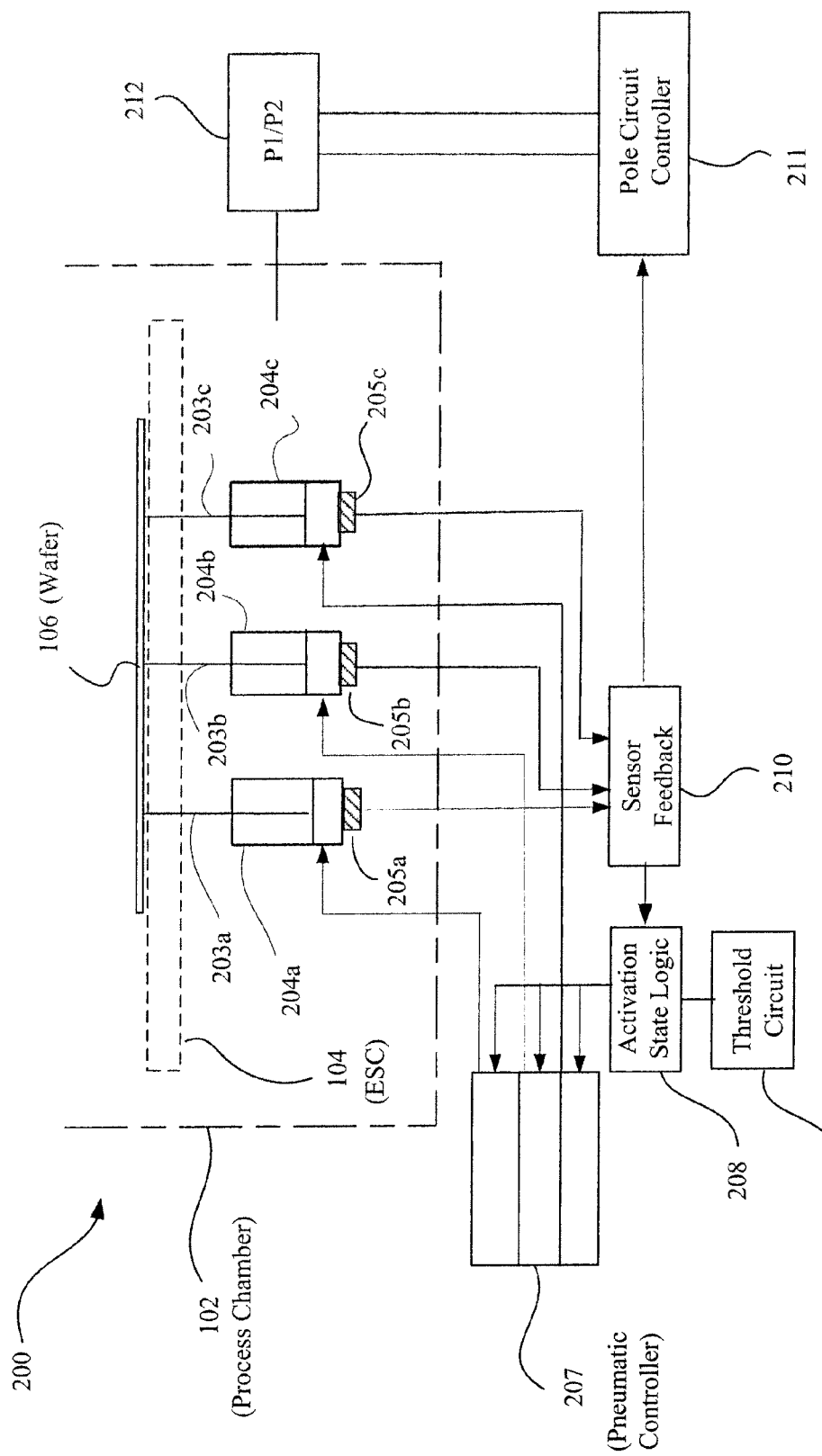
FIG. 2 is a schematic diagram showing a system for electrostatic chucking and dechucking, in accordance with an example embodiment.

FIG. 2 is a schematic diagram showing a system for electrostatic chucking and dechucking, in accordance with an example embodiment. As depicted in this figure, a process chamber 102 includes an electrostatic chuck 104 for gripping or clamping a semiconductor wafer 106. It will be appreciated that in an alternative embodiment, semiconductor wafer 106 might be some other substrate suitable for processing in the process chamber 102. In turn, electrostatic chuck 104 includes bores (or passages) for three lift pins 203a, 203b, and 203c, each of which is connected to a corresponding pneumatic cylinder 204a, 204b, or 204c. Each of these pneumatic cylinders is associated with a corresponding sensor, 205a, 205b, or 205c. It will be appreciated that when in operation, the lift pins 203a, 203b, and 203c exert an upward force against the bottom surface of the semiconductor wafer 106.

A pneumatic controller 207 controls each of the pneumatic cylinders 204a, 204b, and 204c. In an example embodiment, the pneumatic controller 207 includes a separate control module for each cylinder, as is depicted in FIG. 2. However, in an alternative example embodiment, the pneumatic controller 207 might not be so modularized. Also as depicted in this figure, sensors 205a, 205b, and 205c provide data to the sensor feedback module 210. It will be appreciated that this data relates to the electrostatic force (e.g., residual or post-processing) between the electrostatic chuck 104 and the semiconductor wafer 106. In turn, sensor feedback module 210 transmits data based on this data to the activation state logic 208, which might employ a threshold circuit 209, in an example embodiment. So for example, if the data transmitted by a specific sensor indicates an electrostatic force greater than a specific threshold, the activation state logic 208 might use the received data to cause the pneumatic controller 207 to cease further upward movement of a specific lift pin, in that example embodiment.

As also depicted in FIG. 2, sensor feedback module 210 transmits data based on the sensor data to electrical-pole circuit controller 211, which in turn controls polar regions 212 (P1/P2) in electrostatic chuck 104. As will be explained in greater detail below, polar regions 212 might be arranged in specific patterns to facilitate uniform chucking and dechucking of the semiconductor wafer 106. Also, as explained in greater detail below, electrical-pole circuit controller 211 might use the received data to adjust one or more of the polar regions 212 (P1 and/or P2) so as to lessen the electrostatic force between the electrostatic chuck 104 and the semiconductor wafer 106 and thereby facilitate dechucking of the semiconductor wafer 106.

Figure 3A:
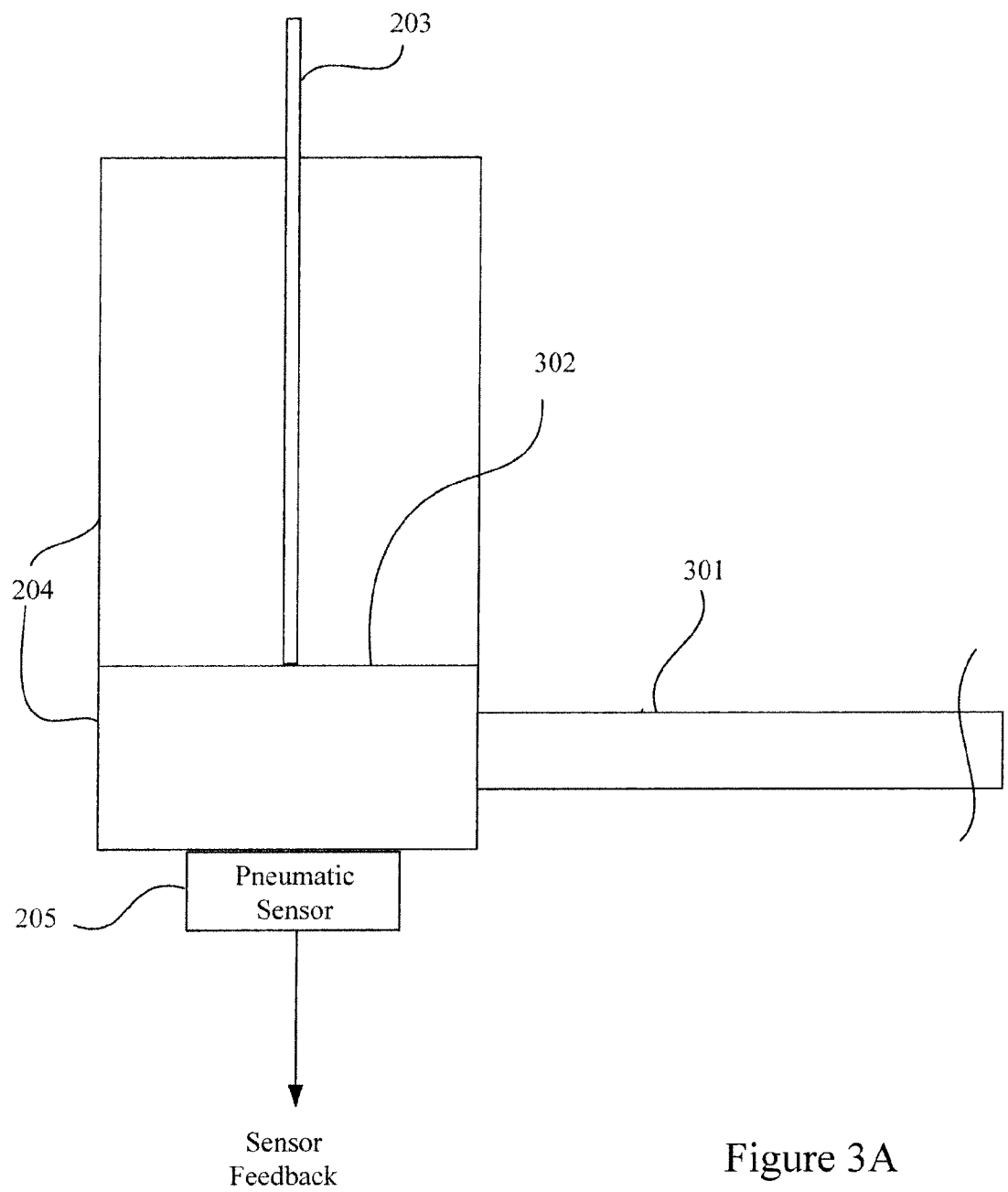
FIG. 3A is a schematic diagram showing a pneumatic lift pin with a pneumatic sensor, in accordance with an example embodiment.

FIG. 3A is a schematic diagram showing a pneumatic lift pin with a pneumatic sensor, in accordance with an example embodiment. As depicted in this figure, pneumatic cylinder 204 includes lift pin 203 and receives air through an input pipe 301. A pneumatic sensor 205 is connected to pneumatic cylinder 204 and measures the air pressure (e.g., in psi) inside the cylinder beneath the piston 302. Pneumatic sensor 205 is located beneath pneumatic cylinder 204. However, this location is merely illustrative. In alternative example embodiments, pneumatic sensor 205 might be on a side of pneumatic cylinder 204 or even connected to input pipe 301. It will be appreciated that the air pressure inside the cylinder 204 beneath the piston 302 (and also the air pressure inside the input pipe 301) will reflect the electrostatic force between the electrostatic chuck and the semiconductor wafer when the lift pin 203 is in contact with the semiconductor wafer. Also as depicted in this figure, the pneumatic sensor 205 transmits its measure of the air pressure to a sensor feedback module, which is not shown but was described in relation to FIG. 2.

Figure 3B:
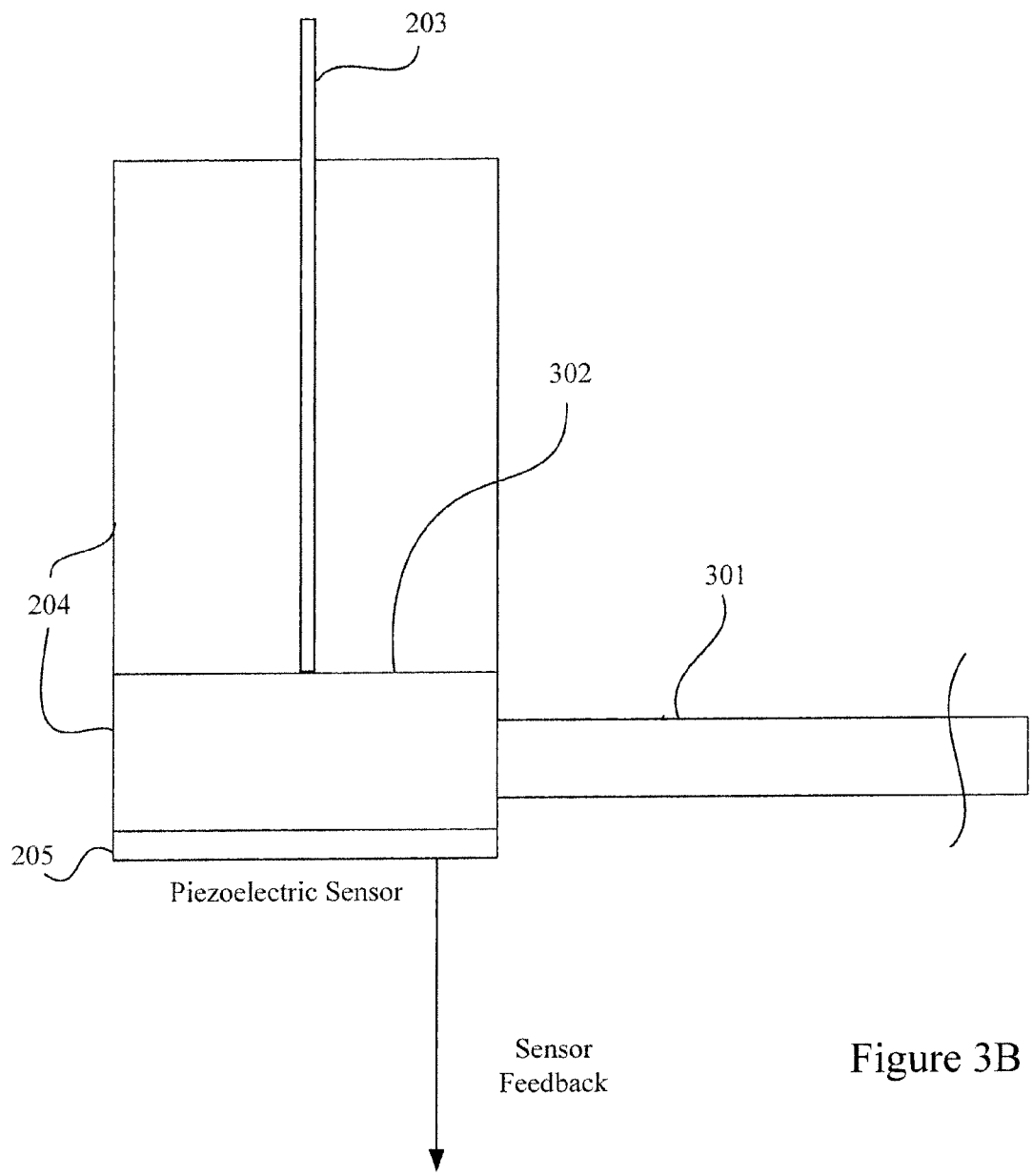
FIG. 3B is a schematic diagram showing a pneumatic lift pin with a piezoelectric sensor, in accordance with an example embodiment.

FIG. 3B is a schematic diagram showing a pneumatic lift pin with a piezoelectric sensor, in accordance with an example embodiment. As depicted in this figure, pneumatic cylinder 204 includes lift pin 203 and receives air through an input pipe 301. A piezoelectric sensor 205 (e.g., a sensor constructed from a piezoelectric material) is connected to pneumatic cylinder 204 and measures the air pressure (e.g., in psi) inside the cylinder beneath the piston 302. Piezoelectric sensor 205 is located beneath pneumatic cylinder 204. However, this location is merely illustrative. In alternative example embodiments, piezoelectric sensor 205 might be on a side of pneumatic cylinder 204 or even connected to input pipe 301. It will be appreciated that the air pressure inside the cylinder 204 beneath the piston 302 (and also the air pressure inside the input pipe 301) will reflect the electrostatic force between the electrostatic chuck and the semiconductor wafer when the lift pin 203 is in contact with the semiconductor wafer. Also as depicted in this figure, the piezoelectric sensor 205 transmits its measure of the air pressure to a sensor feedback module, which is not shown but was described in relation to FIG. 2.

The above examples of sensors are illustrative, rather than limiting. Thus, in alternative example embodiment, the sensor might be a strain gauge or other suitable substitute.

Figure 4A:
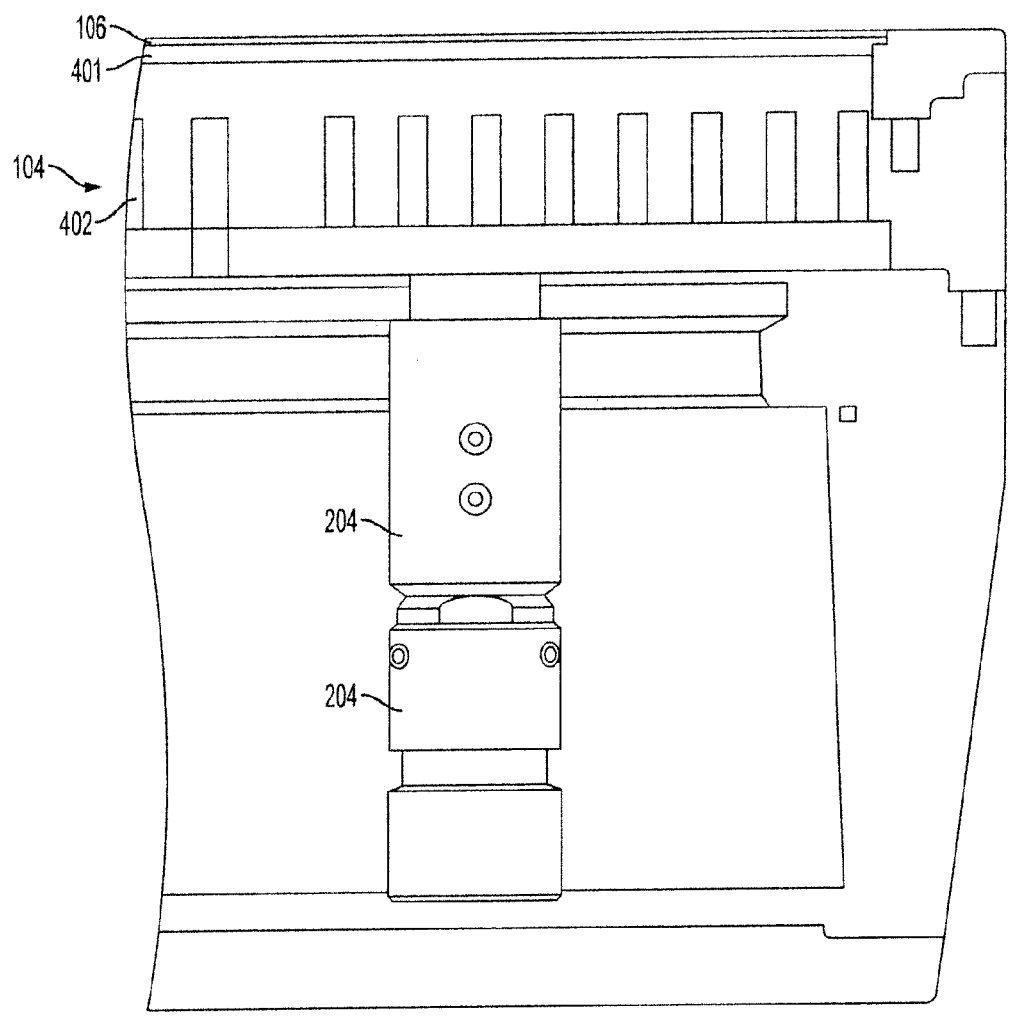
FIG. 4A is a diagram showing a perspective view of a pneumatic cylinder, in accordance with an example embodiment.

FIG. 4A is a diagram showing a perspective view of a pneumatic cylinder, in accordance with an example embodiment. As depicted in this figure, pneumatic cylinder 204 is located below an electrostatic chuck 104 which includes a conductive layer 402 beneath an insulating or dielectric layer 401. A semiconductor wafer 106 is gripped by the electrostatic chuck 104. In an example embodiment, conductive layer 402 might be made of a metal such as aluminum or copper and the insulating or dielectric layer 401 might be made of a material such as alumina (aluminum oxide), quartz, or yttrium, or a ceramic material. However, in another alternative embodiment, other materials with similar properties might be employed.

Figure 4B:
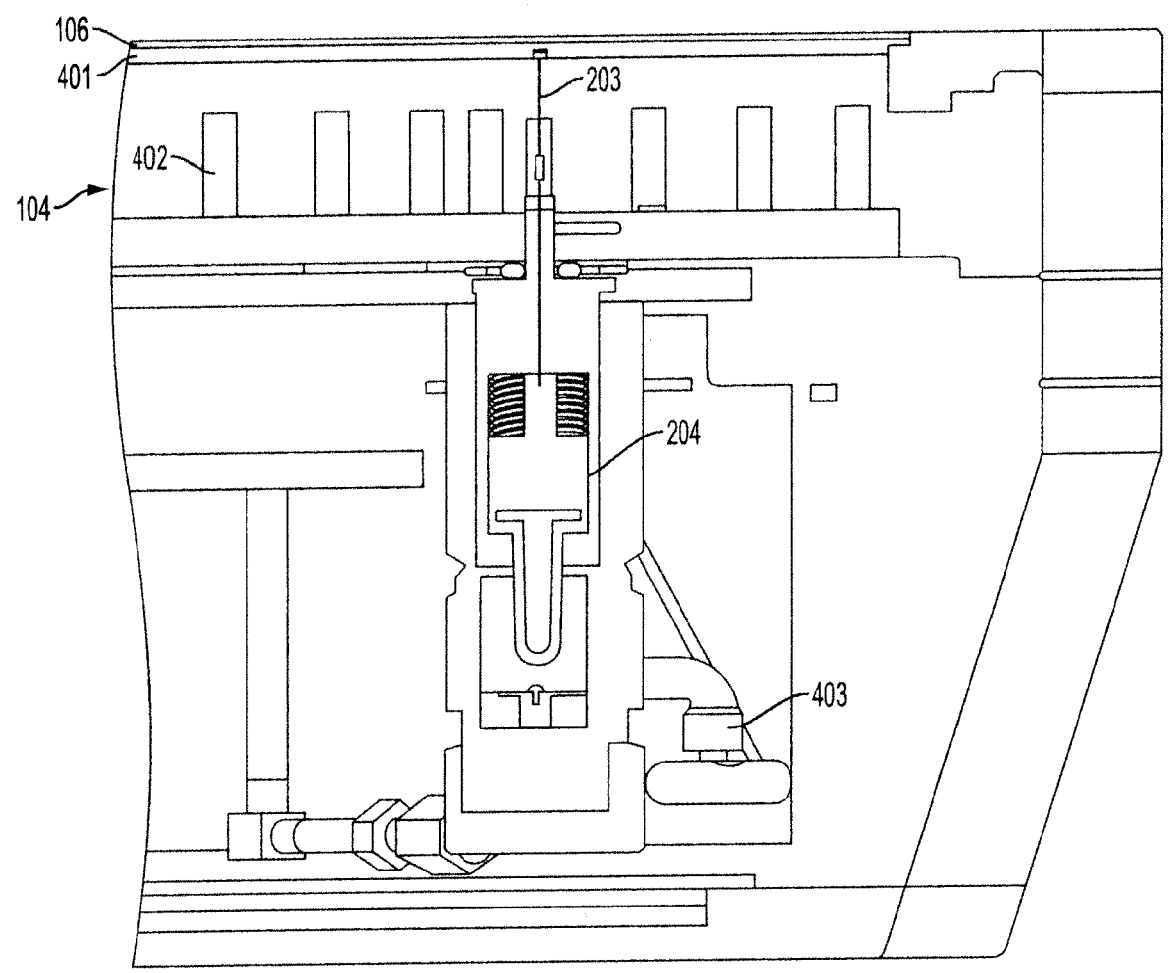
FIG. 4B is a diagram showing a cross-section view of a pneumatic cylinder, in accordance with an example embodiment.

FIG. 4B is a diagram showing a cross-section view of a pneumatic cylinder, in accordance with an example embodiment. As depicted in this figure, a pneumatic cylinder 204 uses a compressed gas from an input tube 403 to raise lift pin 203 through a bore in an electrostatic chuck 104 so that the lift pin 203 comes into contact with a semiconductor wafer 106. As in FIG. 4A, the electrostatic chuck 104 includes a conductive layer 402 beneath an insulating or dielectric layer 401. In an example embodiment, the gas might simply be air, although other suitable gases (e.g., inert gases) might be used in alternative example embodiments. Also, in an example embodiment, the lift pin 203 might be made of the same conductive material (e.g., aluminum) as the conductive layer 402.

Figure 5:
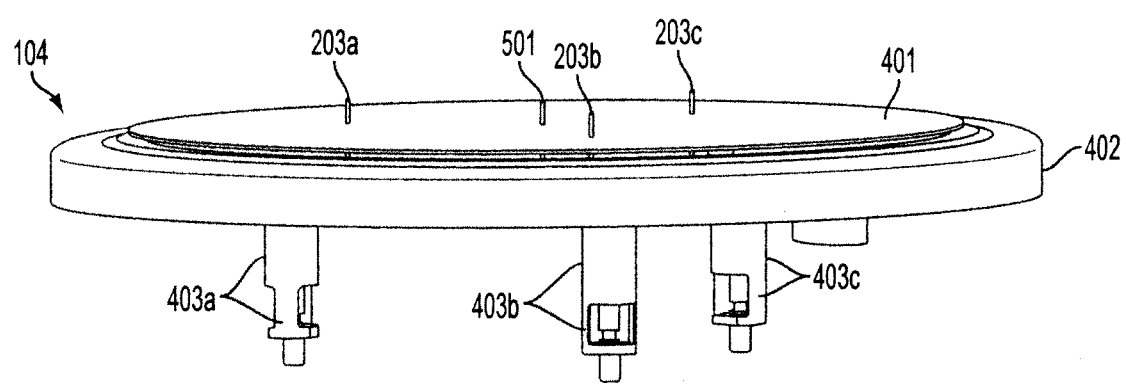
FIG. 5 is a diagram showing a group of lift pins and a sensor pin, in accordance with an alternative example embodiment.

FIG. 5 is a diagram showing a group of lift pins and a sensor pin, in accordance with an alternative example embodiment. As depicted in this figure, the electrostatic chuck 104 includes a conductive layer 402 beneath an insulating or dielectric layer 401. Each of three lift pins 203a, 203b, and 203c pass through the electrostatic chuck 104 and connect to a corresponding lift assembly 403a, 403b, and 403c, respectively, which are connected to a pin lifter yoke (not shown), such as the one described in the following figure. In contrast to the pneumatic cylinders previously described, each of these lift assemblies is not associated with a corresponding sensor. Rather, a sensor pin 501, similar to the lift pin shown in FIG. 3, measures the electrostatic force between the semiconductor wafer and the electrostatic chuck 104. Here again, the sensor pin 501 might be made of the same conductive material (e.g., aluminum) as conductive layer 402. And the sensor pin 501 might be associated with a sensor that is pneumatic, piezoelectric, a strain gauge, etc., in alternative example embodiments.

Figure 6:
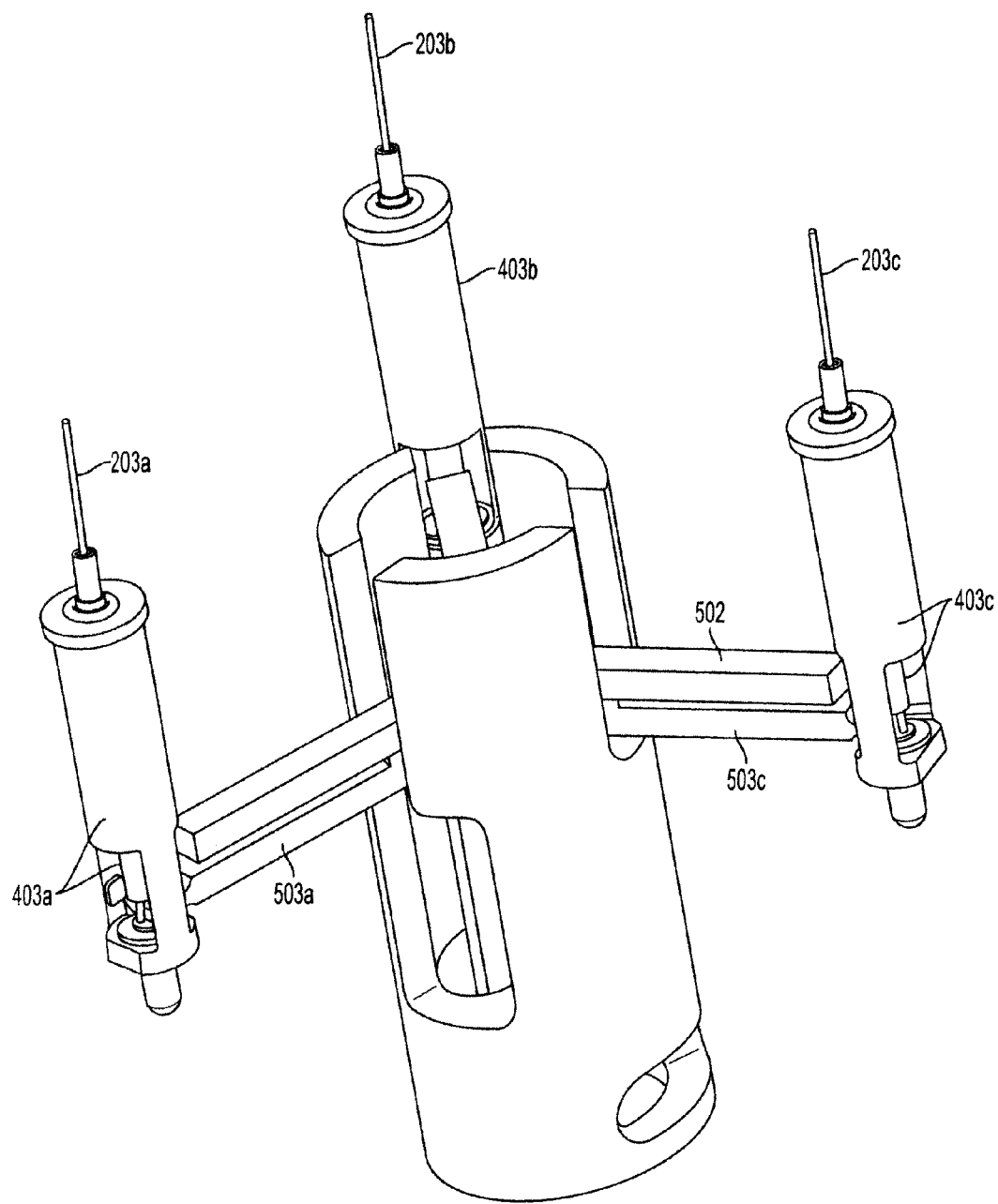
FIG. 6 is a diagram showing a group of lift pins capable of being connected to a single pneumatic cylinder, in accordance with an example embodiment.

FIG. 6 is a diagram showing a group of lift pins capable of being connected to a single pneumatic cylinder, in accordance with an example embodiment. As depicted in the figure, three lift pins 203a, 203b, and 203c are connected to corresponding lift assemblies 403a, 403b, and 403c, respectively. Each of these lift assemblies is connected to a pin lifter yoke 502, which is lifted upward from spokes 503a and 503c (the third spoke is not shown) by a pneumatic cylinder that is not shown. Likewise, the electrostatic chuck through which the lift pins pass is not shown in this figure. It will be appreciated that the pin lifter yoke 502 shown in this figure might be used with the lift pins 203a, 203b, and 203c, shown in FIG. 5, in an example embodiment.

Here it will be appreciated that a sensor pin can also be used with a lift pin that has its own pneumatic cylinder rather than being connected to a pin lifter yoke, in an alternative example embodiment. However, in that example embodiment, the lift pin's pneumatic cylinder would not have a corresponding sensor. The only sensor would be the sensor pin.

Figure 7:
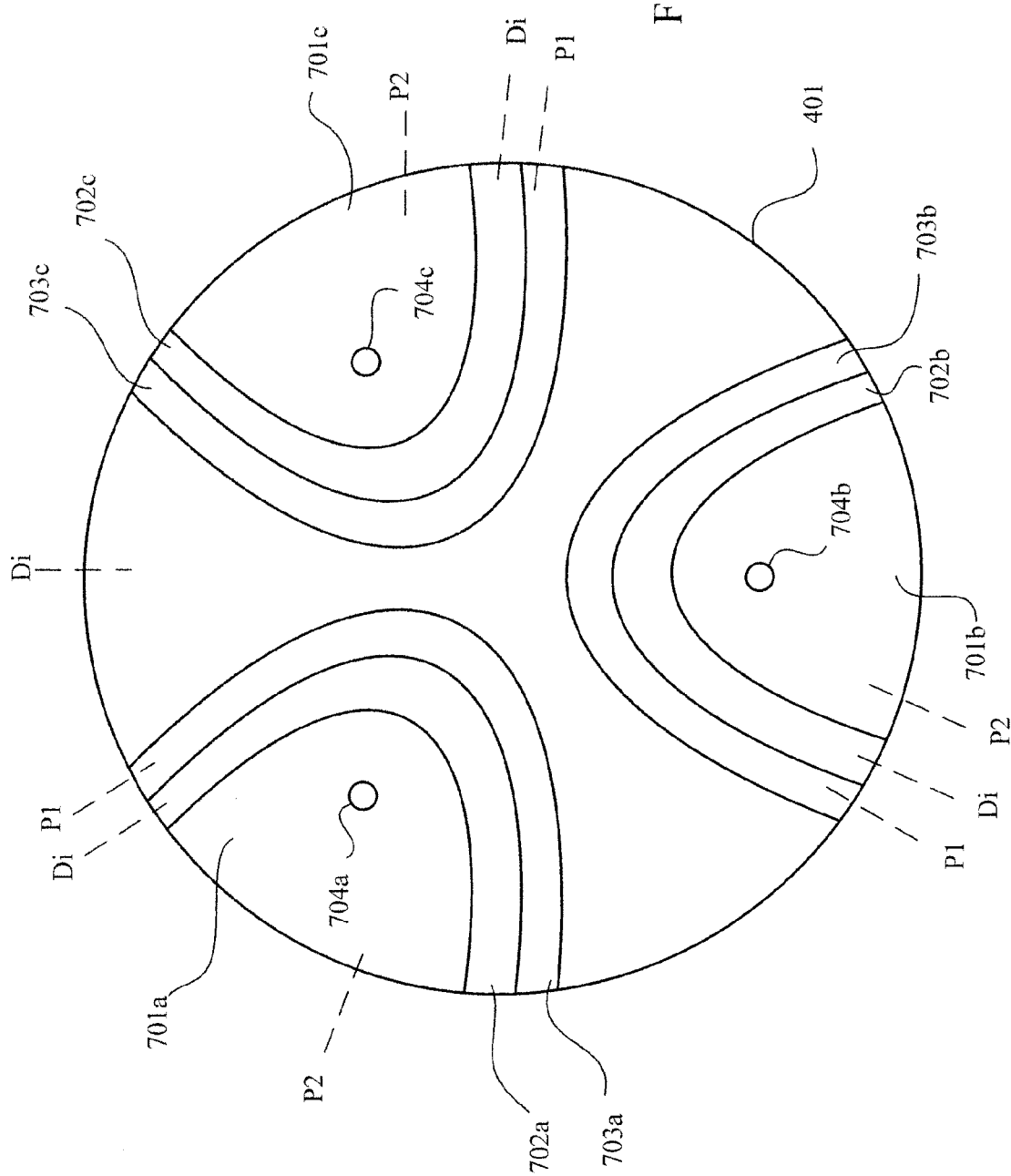
FIG. 7 is a schematic diagram showing a system of multiple zones of patterned polar regions centered on a bore for a lift pin, in accordance with an example embodiment.

FIG. 7 is a schematic diagram showing a system of multiple zones of patterned polar regions around a bore (or passage) for a lift pin, in accordance with an example embodiment. As used herein, the term "around a bore" means that the patterned polar region is located near, adjacent, all the way around, partially around, or centered thereon. However, "centering" does not mean an exact center, but instead, oriented about the center of the bore or passage of the lift pin. As depicted in this figure, an insulating or dielectric layer 401 of an electrostatic chuck has three zones, each of which is centered on a bore for a lift pin. Thus, the zone centered on the bore 704a includes a polar region 701a with an electrical polarity (e.g., positive or negative) P2 separated by a dielectric region 702a from another polar region 703a with an opposite electrical polarity P1. Similarly, the zone around the bore 704b includes a polar region 701b with an electrical polarity (e.g., positive or negative) P2 separated by a dielectric region 702b from another polar region 703b with an opposite electrical polarity P1. And zone around the bore 704c includes a polar region 701c with an electrical polarity (e.g., positive or negative) P2 separated by a dielectric region 702c (Di) from another polar region 703c with an opposite electrical polarity P1. Here it will be appreciated that each polar region achieves its polarity (e.g., positive or negative) by operation of an applied voltage (e.g., direct current or DC). So for example, polar region 703a might include an embedded conductive layer (or electrode pattern) that receives an applied voltage (e.g., direct current or DC) through the P1 circuitry. And polar region 701a includes an embedded conductive layer (or electrode pattern) that receives an applied voltage (e.g., direct current or DC) through the P2 circuitry.

In an example embodiment, there might be an approximate equality of the total surface area of polar regions with P1 polarity and of the total surface area of polar regions with P2 polarity. During gripping or chucking of the semiconductor wafer, the same voltage might be applied to each of the total surface areas, to prevent warping. However, in alternative example embodiments, the total surface area of polar regions with P1 polarity might differ from the total surface area of polar regions with P2 polarity and the voltage applied to each of these total surface areas might also differ.

In an alternative example embodiment, the electrostatic chuck might be unipolar, rather than bipolar. In such an embodiment, there would be no polar regions with polarity P2. So, for example, both polar regions 701a and 703a in a zone might be associated with P1, though still separated by a dielectric region 702a and still centered on or around a bore for a lift pin 704a in the insulating or dielectric layer 401.

Figure 8:
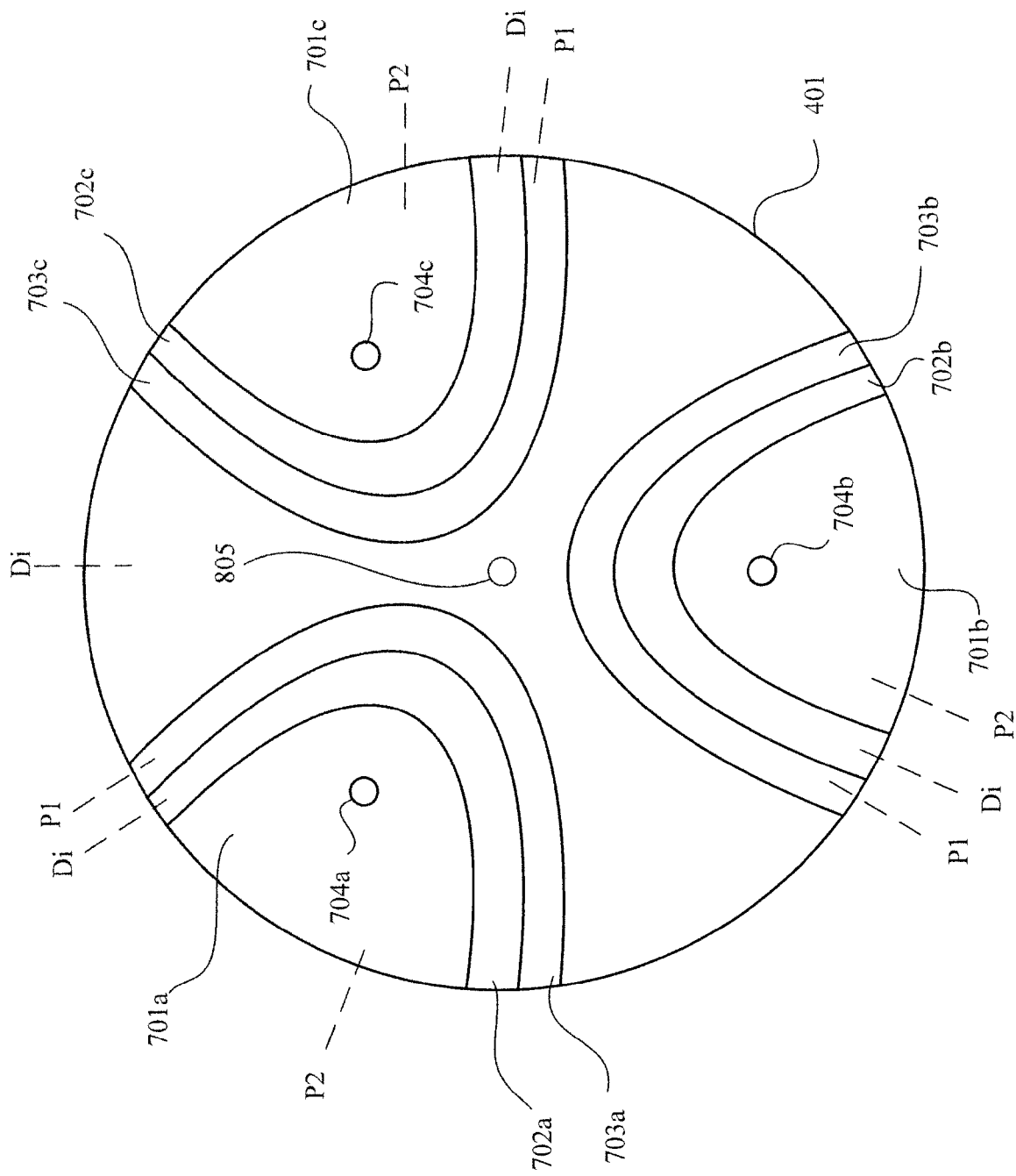
FIG. 8 is a schematic diagram showing a system with a sensor pin and multiple zones of patterned polar regions centered on a bore for a lift pin, in accordance with an example embodiment.

FIG. 8 is a schematic diagram showing a system with a sensor pin and multiple zones of patterned polar regions centered on or around a bore for a lift pin, in accordance with an example embodiment. For the most part, FIG. 8 is identical to FIG. 7. Thus, an insulating or dielectric layer 401 of an electrostatic chuck has three zones, each of which is around a bore for a lift pin. Thus, the zone around the bore 704a includes a polar region 701a with an electrical polarity (e.g., positive or negative) P2 separated by a dielectric region 702a from another polar region 703a with an opposite electrical polarity P1. Similarly, the zone around the bore 704b includes a polar region 701b with an electrical polarity (e.g., positive or negative) P2 separated by a dielectric region 702b from another polar region 703b with an opposite electrical polarity P1. And the zone around the bore 704c includes a polar region 701c with an electrical polarity (e.g., positive or negative) P2 separated by a dielectric region 702c (Di) from another polar region 703c with an opposite electrical polarity P1.

Additionally, FIG. 8 shows a bore 805 for a sensor pin, as described earlier. Thus, FIG. 8 might be used in an example embodiment with the pin lifter yoke depicted in FIG. 5B or in an example embodiment where a lift pin's pneumatic cylinder lacks a corresponding sensor.

Figure 9:
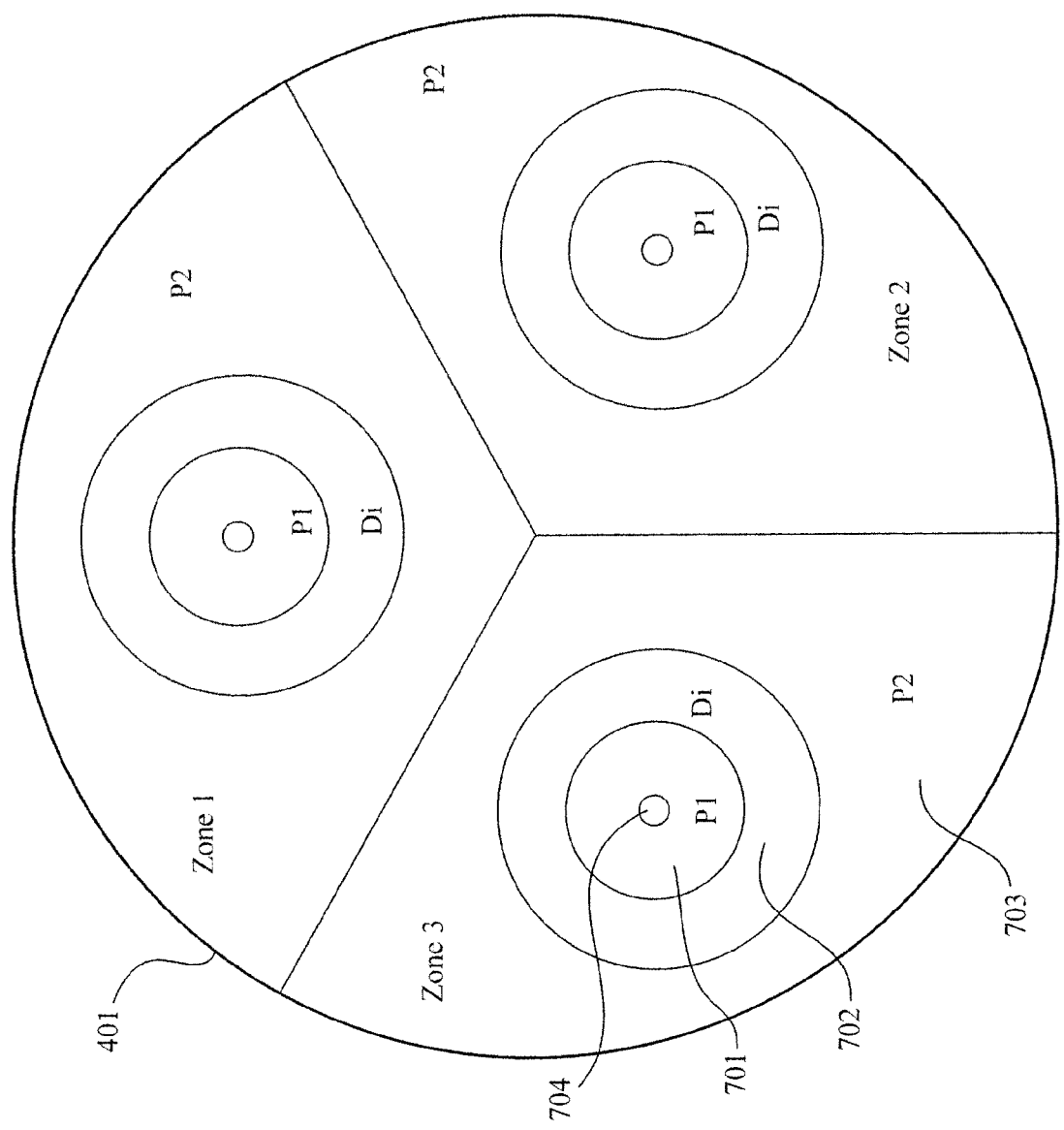
FIG. 9 is a schematic diagram showing a system with an alternative pattern for polar regions centered on a bore for a lift pin, in accordance with an example embodiment.

FIG. 9 is a schematic diagram showing a system with an alternative pattern for polar regions centered on or around a bore for a lift pin, in accordance with an example embodiment. As depicted in this figure, an insulating or dielectric layer 401 of an electrostatic chuck has three zones, Zone 1, Zone 2, and Zone 3. Once again, each zone is around a bore for a lift pin. Thus, the zone around the bore 704 includes a polar region 701 with an electrical polarity (e.g., positive or negative) P1 separated by a dielectric region 702 from another polar region 703 with an opposite electrical polarity P2. In contrast to earlier example embodiments in which the polar regions were shaped as half-rings, the polar regions in this example embodiment are shaped as rings.

Figure 10:
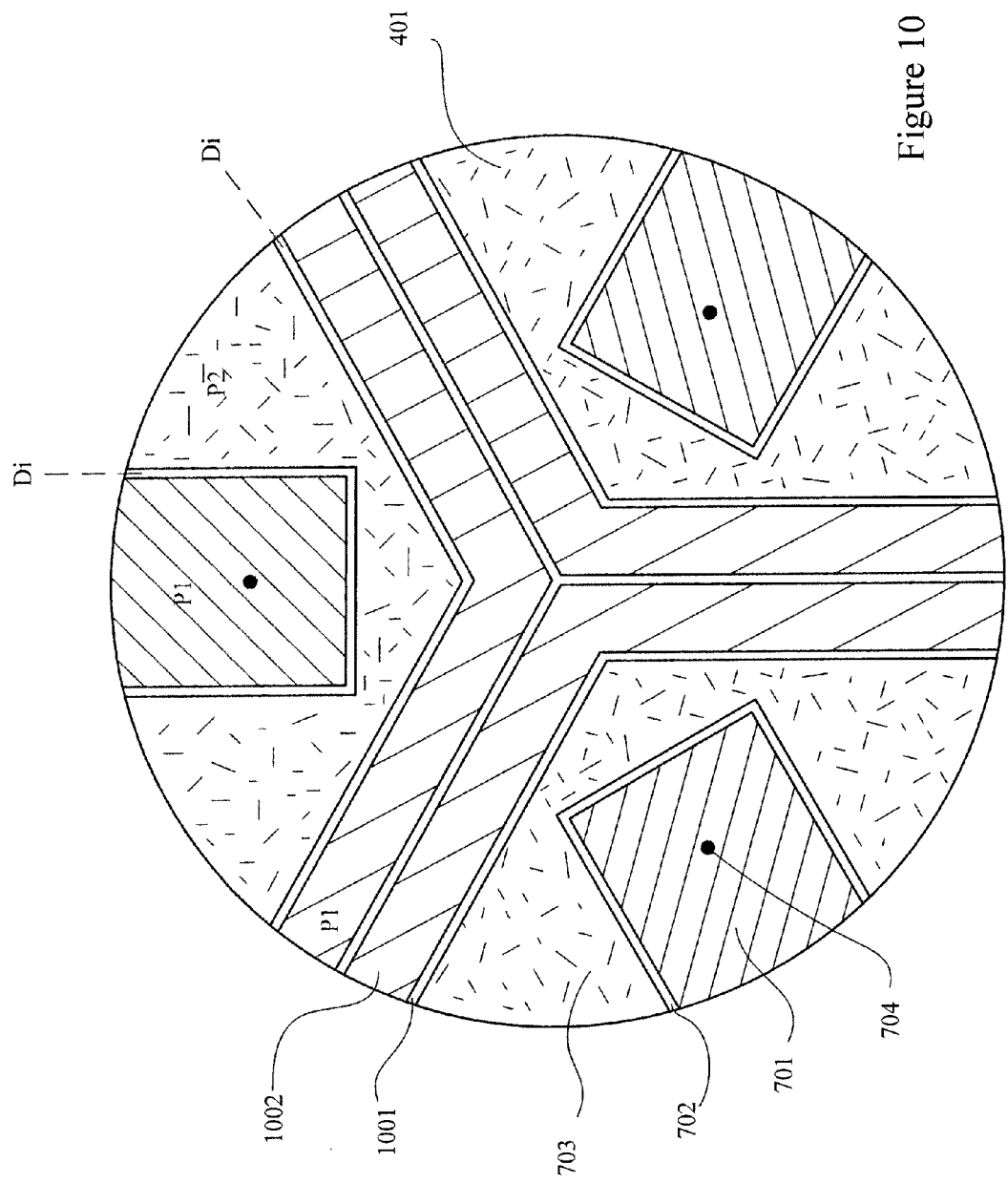
FIG. 10 is a schematic diagram showing a system with another alternative pattern for polar regions centered on a bore for a lift pin, in accordance with an example embodiment.

FIG. 10 is a schematic diagram showing a system with another alternative pattern for polar regions around a bore for a lift pin, in accordance with an example embodiment. As depicted in this figure, an insulating or dielectric layer 401 of an electrostatic chuck has three zones, each of which is around a bore for a lift pin. Thus, the zone around the bore 704 includes a polar region 701 with an electrical polarity (e.g., positive or negative) P1, which is separated by a dielectric region 702 from another polar region 703 with an opposite electrical polarity P2, which, in turn, is separated from another polar region 1002 with a polarity P1 by a dielectric region 1001. It will be appreciated that other geometric patterns might be substituted for the geometric patterns shown, e.g., in FIGS. 8-10. That is to say, the geometric patterns shown in those figures are intended to be illustrative, rather than limiting.

It will be appreciated that the figures described above, the dielectric layer 401 included three zones. In alternative example embodiments, there might be only two zones or there might be four, five, six or more zones. Generally, the number of zones is determined by the number of lift pins, although some embodiments might have fewer or more zones than lift pins.

Figure 11A:
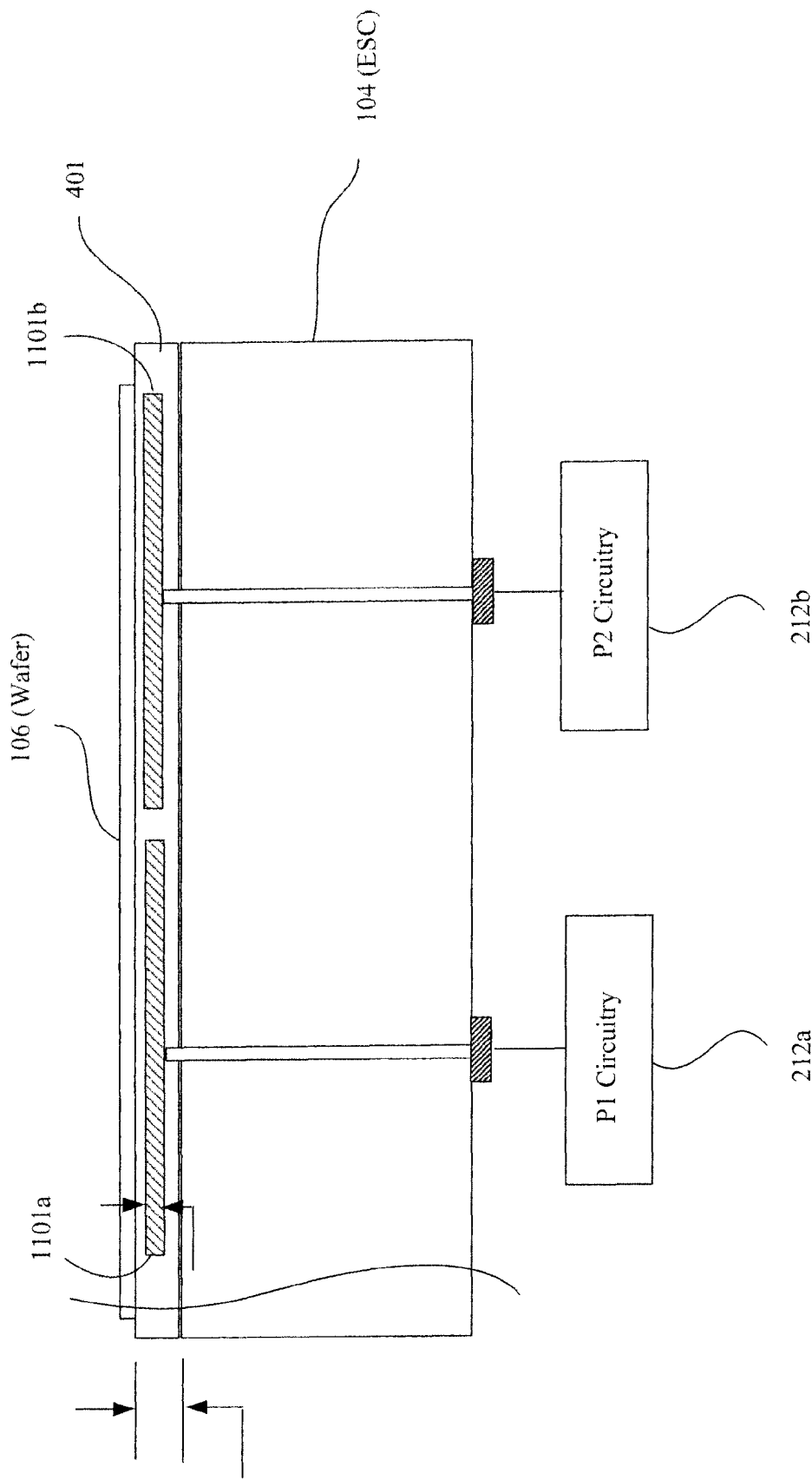
FIG. 11A is a schematic diagram showing a system for creating two polar regions, in accordance with an example embodiment.

FIG. 11A is a schematic diagram showing a system for creating two polar regions, in accordance with an example embodiment. As depicted in this figure, a semiconductor wafer 106 is gripped by an insulating or dielectric layer 401 of an electrostatic chuck 104. Inside the insulating or dielectric layer 401 are two embedded conductive layers, 1101a and 1101b, which are sometimes referred to as "electrode patterns". See, e.g., co-owned U.S. Pat. No. 7,525,787, which is incorporated herein by reference. These embedded layers might be made from a metal such as tungsten, although other suitable materials (including other metals such as copper) might be used in alternative example embodiments. In an example embodiment, the thickness A of the insulating or dielectric layer 401 might be in the range of approximately 0.02-0.06 inch, and the thickness B of the embedded conductive layer 1101a or 1101b might be in the range of approximately of 0.0001-0.0005 inch.

Also, as depicted in FIG. 11A, each embedded layer is connected to corresponding circuitry for creating a polar region (e.g., positive or negative) that contributes to the electrostatic force between the semiconductor wafer and the electrostatic chuck. Thus, embedded conductive layer 1101a is connected to P1 (Pole 1) circuitry 212a and embedded conductive layer 1101b is connected to P2 (Pole 2) circuitry 212b. It will be appreciated that the diagram in FIG. 11A has been truncated for purposes of illustration and emphasis, as indicated by the S-shaped line bisecting the electrostatic chuck 104 and the semiconductor wafer 106 on the left. If not truncated, the dielectric layer 401 would include additional embedded conductive layers.

Figure 11B:
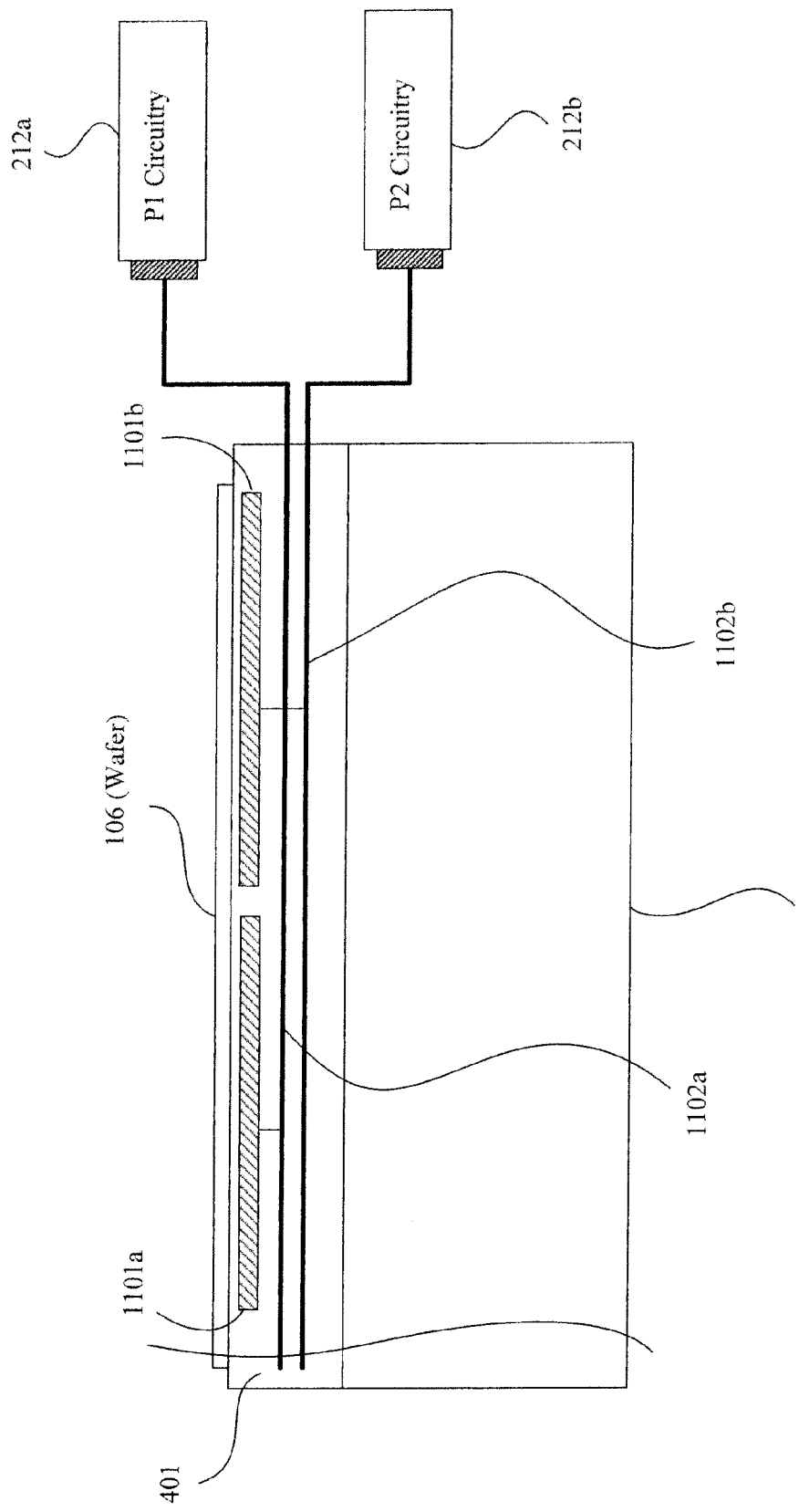
FIG. 11B is a schematic diagram showing a system for creating two polar regions using circuitry in a dielectric layer, in accordance with an example embodiment.

FIG. 11B is a schematic diagram showing a system for creating two polar regions using circuitry in a dielectric layer, in accordance with an example embodiment. As depicted in this figure, a semiconductor wafer 106 is gripped by an insulating or dielectric layer 401 of an electrostatic chuck 104. Inside the insulating or dielectric layer 401 are two embedded conductive layers, 1101a and 1101b. Also inside the insulating or dielectric layer 401 are two electrical connections 1102a and 1102b. Electrical connection 1102a connects (e.g., through a hole in dielectric layer 401) embedded conductive layer 1101a to P1 (Pole 1) circuitry 212a to create a polar region (e.g., positive or negative). Similarly, electrical connection 1102b connects (e.g., through a hole in dielectric layer 401) embedded conductive layer 1101b to P2 (Pole 2) circuitry 212b to create a polar region (e.g., positive or negative). Again it will be appreciated that the diagram in FIG. 11B has been truncated for purposes of illustration and emphasis, as indicated by the S-shaped line bisecting the electrostatic chuck 104 and the semiconductor wafer 106 on the left. If not truncated, the dielectric layer 401 would include additional embedded conductive layers.

It will be appreciated that a dielectric layer with embedded conductive layers and electrical connections as in FIG. 11B can be manufactured using existing microfabrication or micromanufacturing techniques.

Figure 12:
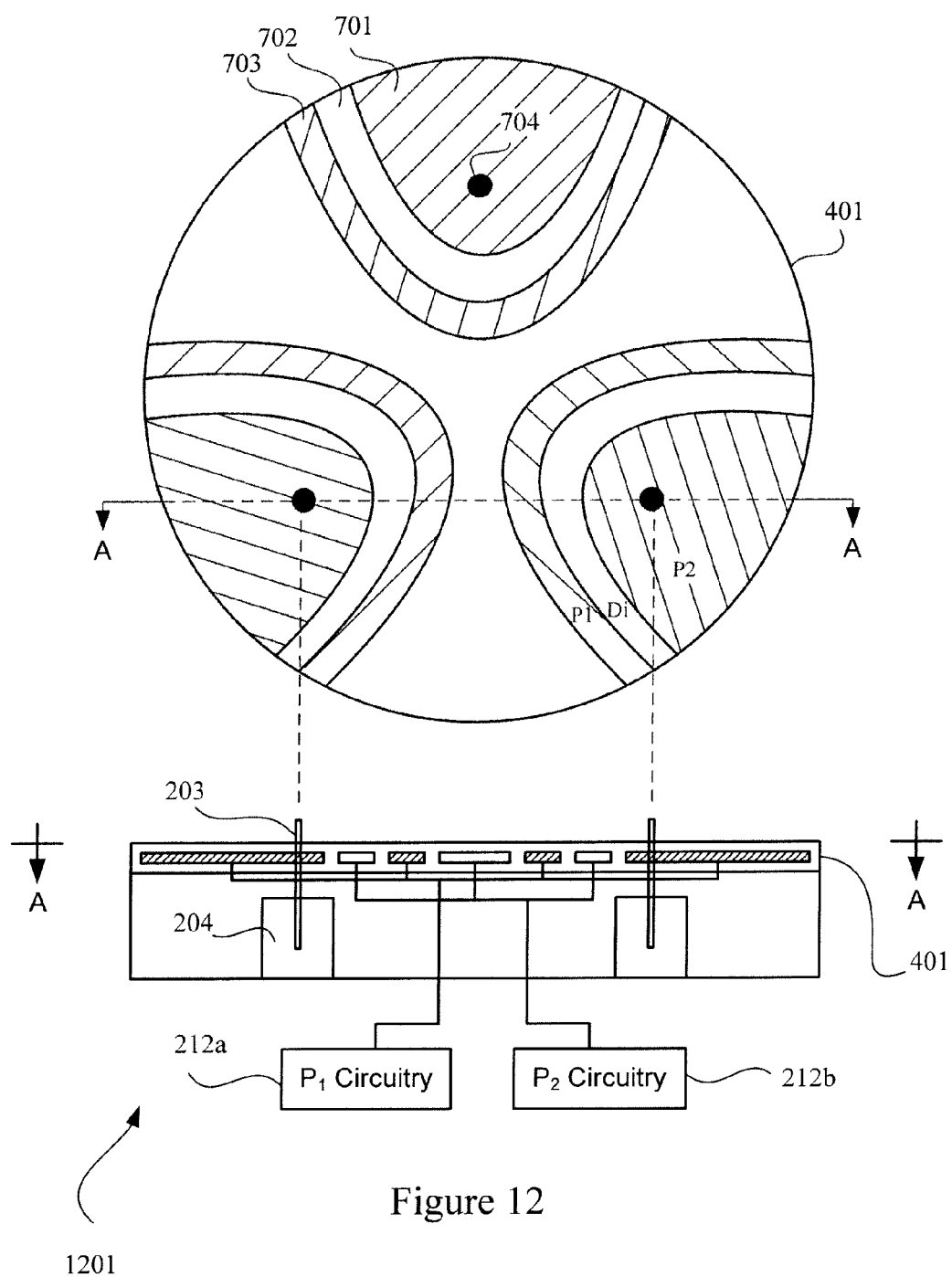
FIG. 12 is a schematic diagram showing a cross-sectional view of a system with multiple zones of patterned polar regions centered on a bore for a lift pin, in accordance with an example embodiment.

FIG. 12 is a schematic diagram showing a cross-sectional view of a system with multiple zones of patterned polar regions around a bore for a lift pin, in accordance with an example embodiment. As depicted in this figure, an insulating or dielectric layer 401 of an electrostatic chuck has three zones, each of which is around a bore for a lift pin. Thus, the zone around the bore 704 includes a polar region 701 with an electrical polarity (e.g., positive or negative) P2 separated by a dielectric region 702 from another polar region 703 with an opposite electrical polarity P1.

The cross-sectional view 1201 includes the insulating or dielectric layer 401, along with its circuitry and two of the lift pins 203 that pass through the layer. Each of those lift pins has a corresponding pneumatic cylinder 204. As shown in the cross-sectional view 1201, the P1 circuitry 212a is connected to polar region 703 and the P2 circuitry 212b is connected to polar region 701. Here it will be recalled that each polar region includes an embedded conductive layer made of a material such as tungsten, which creates the region's polarity (positive or negative) when voltage (e.g., direct current or DC) is applied to the circuitry.

Figure 13:
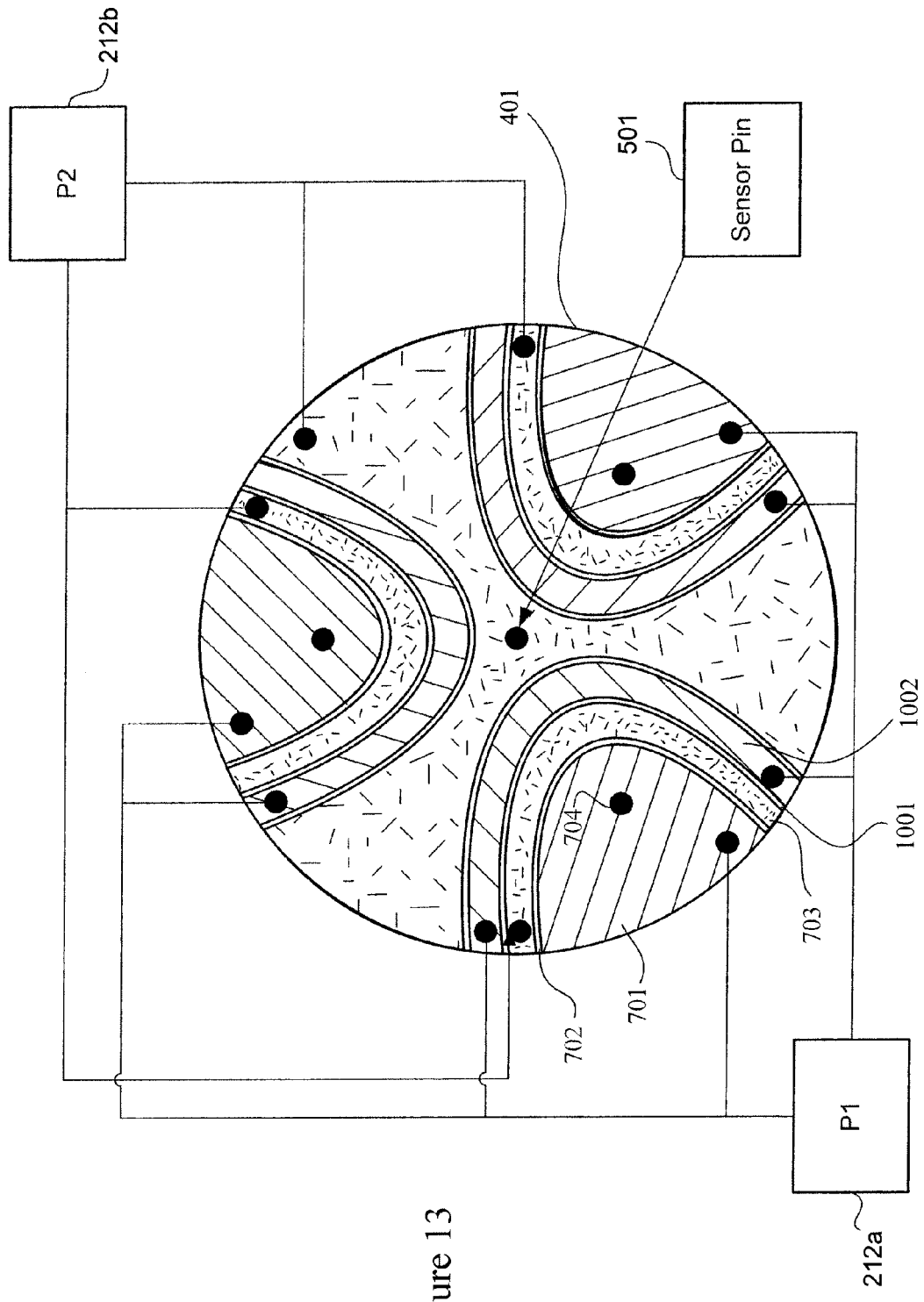
FIG. 13 is a schematic diagram showing the electrical circuitry for a system with multiple zones of patterned polar regions centered on a bore for a lift pin, in accordance with an example embodiment.

FIG. 13 is a schematic diagram showing the electrical circuitry for a system with multiple zones of patterned polar regions around a bore for a lift pin, in accordance with an example embodiment. As depicted in this figure, an insulating or dielectric layer 401 of an electrostatic chuck has three zones, each of which is around a bore for a lift pin. The zone around the bore 704 includes a polar region 701 with an electrical polarity (e.g., positive or negative) P1, which is separated by a dielectric region 702 from another polar region 703 with an opposite electrical polarity P2, which, in turn, is separated from another polar region 1002 with a polarity P1 by a dielectric region 1001. Insulating or dielectric layer 401 also includes a bore for sensor pin 501. As shown in this figure, the P1 circuitry 212a is connected to polar regions 701 and 1001 and the P2 circuitry 212b is connected to polar region 703. Once again, it will be recalled that each polar region includes an embedded conductive layer made of a material such as tungsten, which creates the region's polarity (positive or negative) when voltage (e.g., direct current or DC) is applied to the circuitry.

Figure 14:
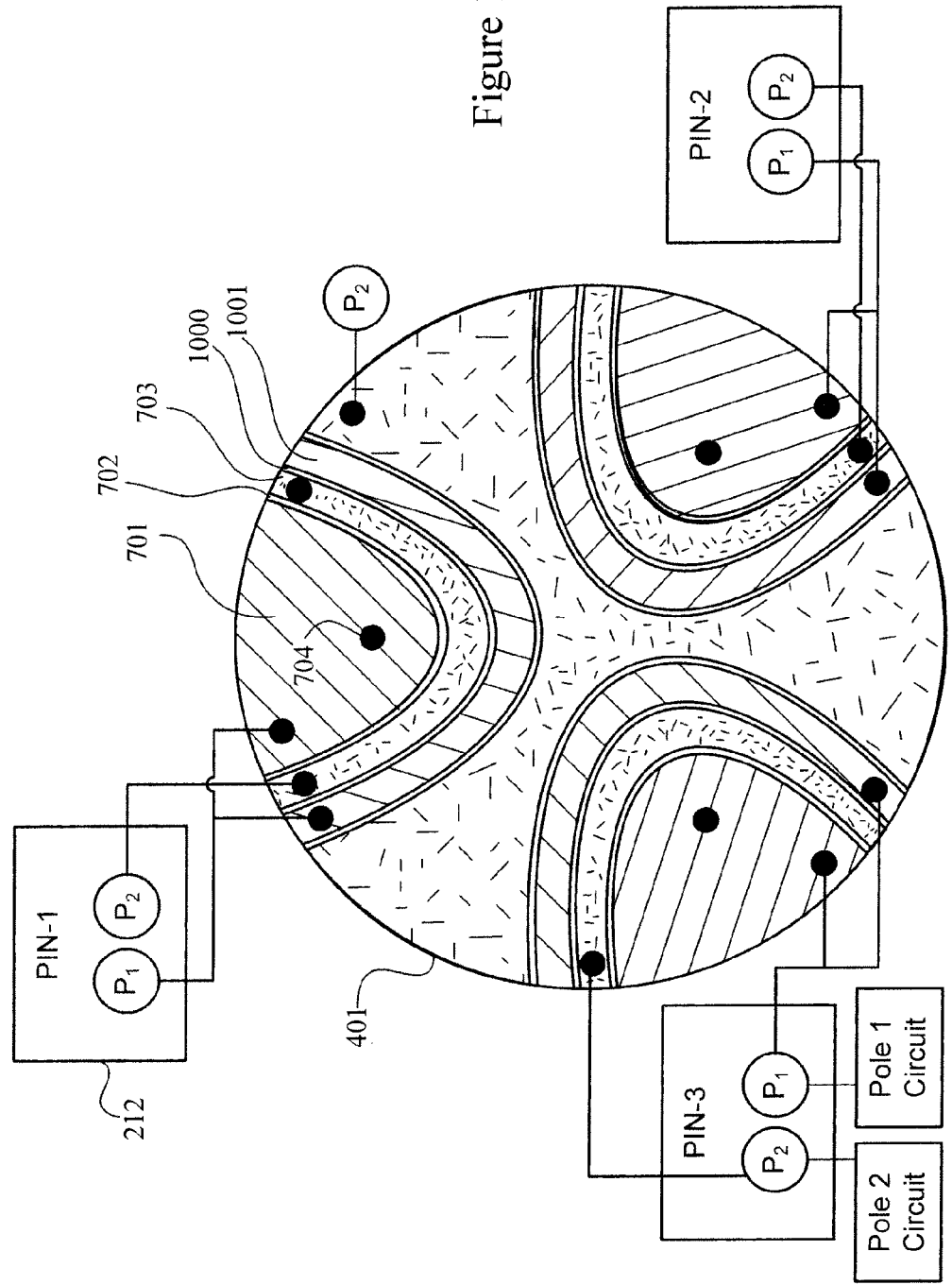
FIG. 14 is a schematic diagram showing alternative electrical circuitry for a system with multiple zones of patterned polar regions centered on a bore for a lift pin, in accordance with an example embodiment.

FIG. 14 is a schematic diagram showing alternative electrical circuitry for a system with multiple zones of patterned polar regions around a bore for a lift pin, in accordance with an example embodiment. As depicted in this figure, an insulating or dielectric layer 401 of an electrostatic chuck has three zones, each of which is around a bore for a lift pin. The zone around the bore 704 includes a polar region 701 with an electrical polarity (e.g., positive or negative) P1, which is separated by a dielectric region 702 from another polar region 703 with an opposite electrical polarity P2, which, in turn, is separated from another polar region 1002 with a polarity P1 by a dielectric region 1001.

As shown in this figure, the P1 circuitry in 212 (PIN-1) is connected to polar regions 701 and 1001 and the P2 circuitry in 212 is connected to polar region 703. Here it will be appreciated that each zone has its own P1-P2 circuitry, e.g., PIN-1, PIN-2, and PIN-3, respectively. This circuitry arrangement contrasts with the circuitry arrangement shown in FIG. 13, where the P1 circuitry connected to all three zones, as did the P2 circuitry. Of course, in the latter circuitry arrangement, different voltages cannot be applied to the P1 regions in different zones. In the circuitry arrangement shown in FIG. 14, different voltages can be applied to P1 in the first zone, P1 in the second zone, and P1 in the third zone, for example.

Figure 15:
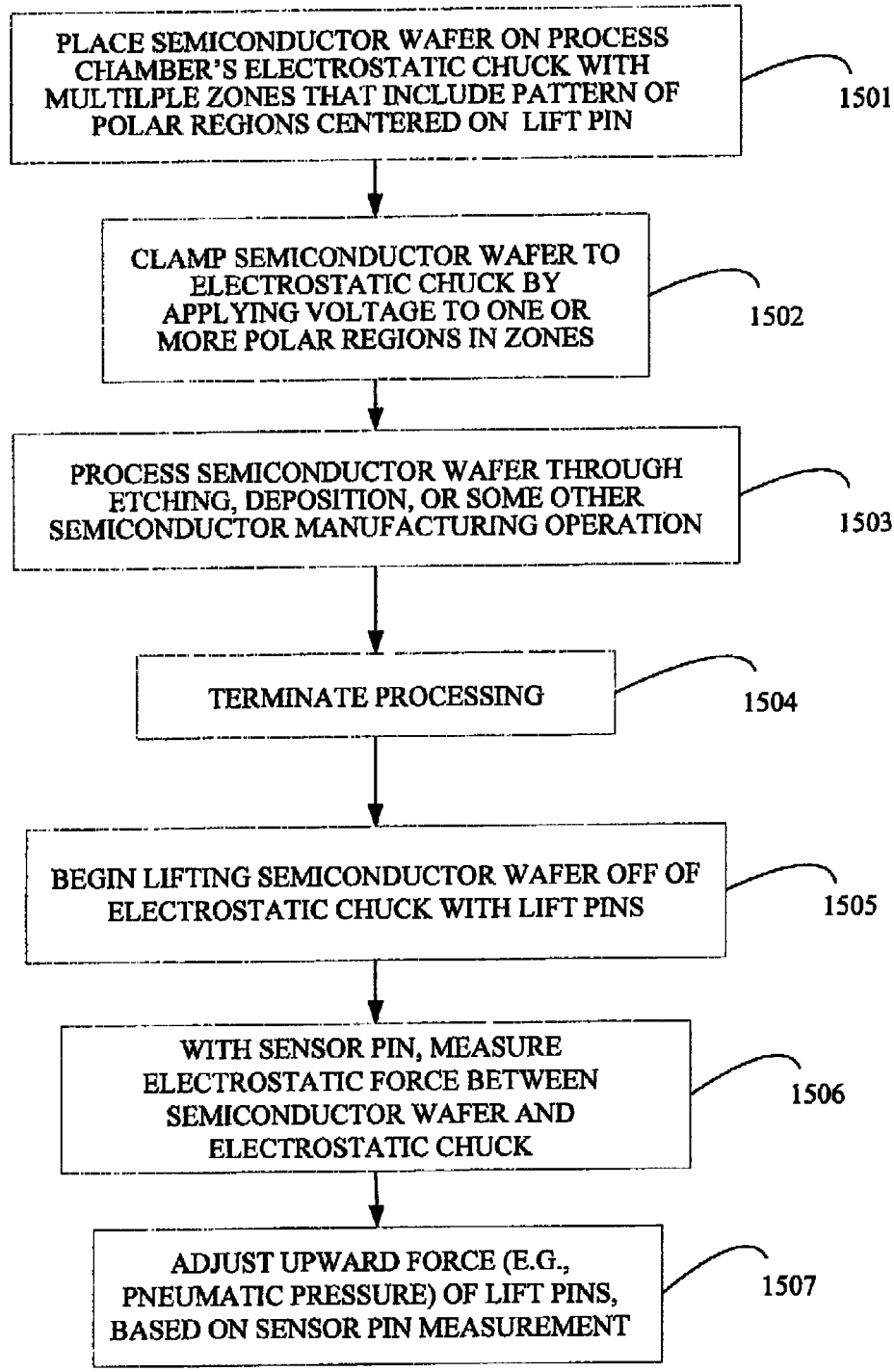
FIG. 15 is a flowchart diagram showing a process for processing a semiconductor wafer in a process chamber with an electrostatic chuck with a sensor pin, in accordance with an example embodiment.

FIG. 15 is a flowchart diagram showing a process for processing a semiconductor wafer in a process chamber with an electrostatic chuck with a sensor pin, in accordance with an example embodiment. The process is described from the point of view of a process controller, which in an example embodiment, might include an application program executing on an x86-processor platform with a Linux or Windows operating system.

In operation 1501 of the process, the process controller places a semiconductor wafer on a process chamber's electrostatic chuck with multiple zones, each of which includes a pattern of polar regions around a lift pin, as described above. In operation 1502, the process controller clamps the semiconductor wafer to the electrostatic chuck by applying voltage (e.g., direct current or DC) to one or more of the polar regions in the zones. Then in operation 1503, the process controller processes the semiconductor wafer through generating a plasma and using the plasma to etch the substrate, deposit a material on the substrate, or perform some other semiconductor manufacturing operation.

The process controller terminates the processing in operation 1504. In operation 1505, the process controller begins lifting the semiconductor wafer off of the electrostatic chuck with the lift pins. The process controller then measures, with a sensor pin as described above, the electrostatic force between the semiconductor wafer and the electrostatic chuck, in operation 1506. In operation 1507, the process controller adjusts the upward force (e.g., pneumatic pressure) of the lift pins, based on the sensor pin's measurement.

Figure 16:
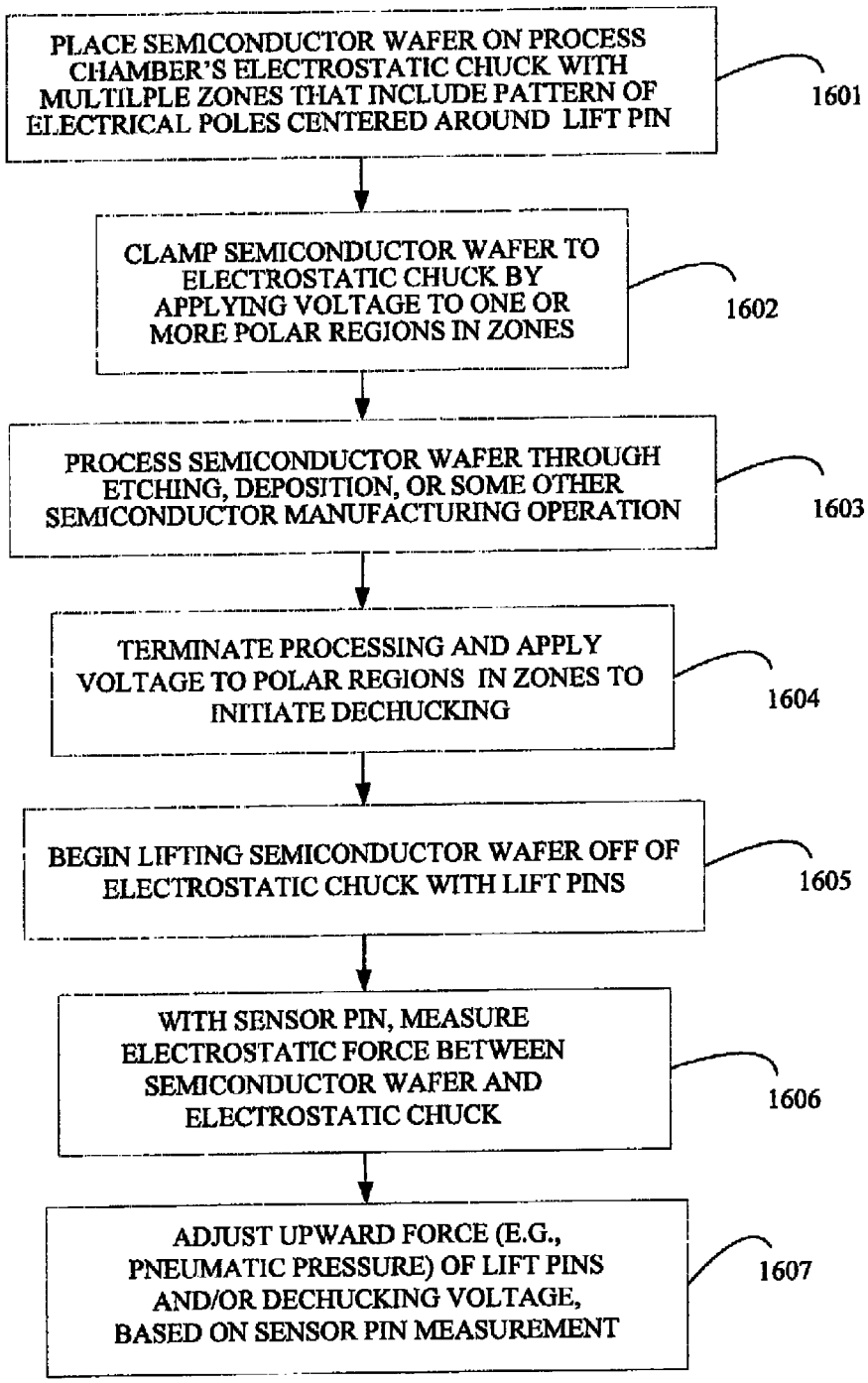
FIG. 16 is a flowchart diagram showing another process for processing a semiconductor wafer in a process chamber with an electrostatic chuck with a sensor pin, in accordance with an example embodiment.

FIG. 16 is a flowchart diagram showing another process for processing a semiconductor wafer in a process chamber with an electrostatic chuck with a sensor pin, in accordance with an example embodiment. In operation 1601 of the process, the process controller places a semiconductor wafer on a process chamber's electrostatic chuck with multiple zones, each of which includes a pattern of polar regions around a lifting pin. In operation 1602, the process controller clamps the semiconductor wafer to the electrostatic chuck by applying voltage (e.g., direct current or DC) to one or more of the polar regions in the zones. Then in operation 1603, the process controller processes the semiconductor wafer through generating a plasma and using the plasma to etch the substrate, deposit a material on the substrate, or perform some other semiconductor manufacturing operation.

The process controller terminates the processing and applies a voltage (e.g., direct current or DC) to the polar regions to initiate dechucking, in operation 1604. It will be appreciated that this application of voltage did not occur in the process shown in FIG. 15. Such dechucking voltages are described in U.S. Pat. No. 5,612,850, which is incorporated herein by reference. Then in operation 1605 of the process shown in FIG. 16, the process controller begins lifting the semiconductor wafer off of the electrostatic chuck with the lift pins. The process controller measures, with a sensor pin as described above, the electrostatic force between the semiconductor wafer and the electrostatic chuck, in operation 1606. In operation 1607, the process controller adjusts the upward force (e.g., pneumatic pressure) of lift pins and/or the dechucking voltage, based on the sensor pin's measurement.

Figure 17:
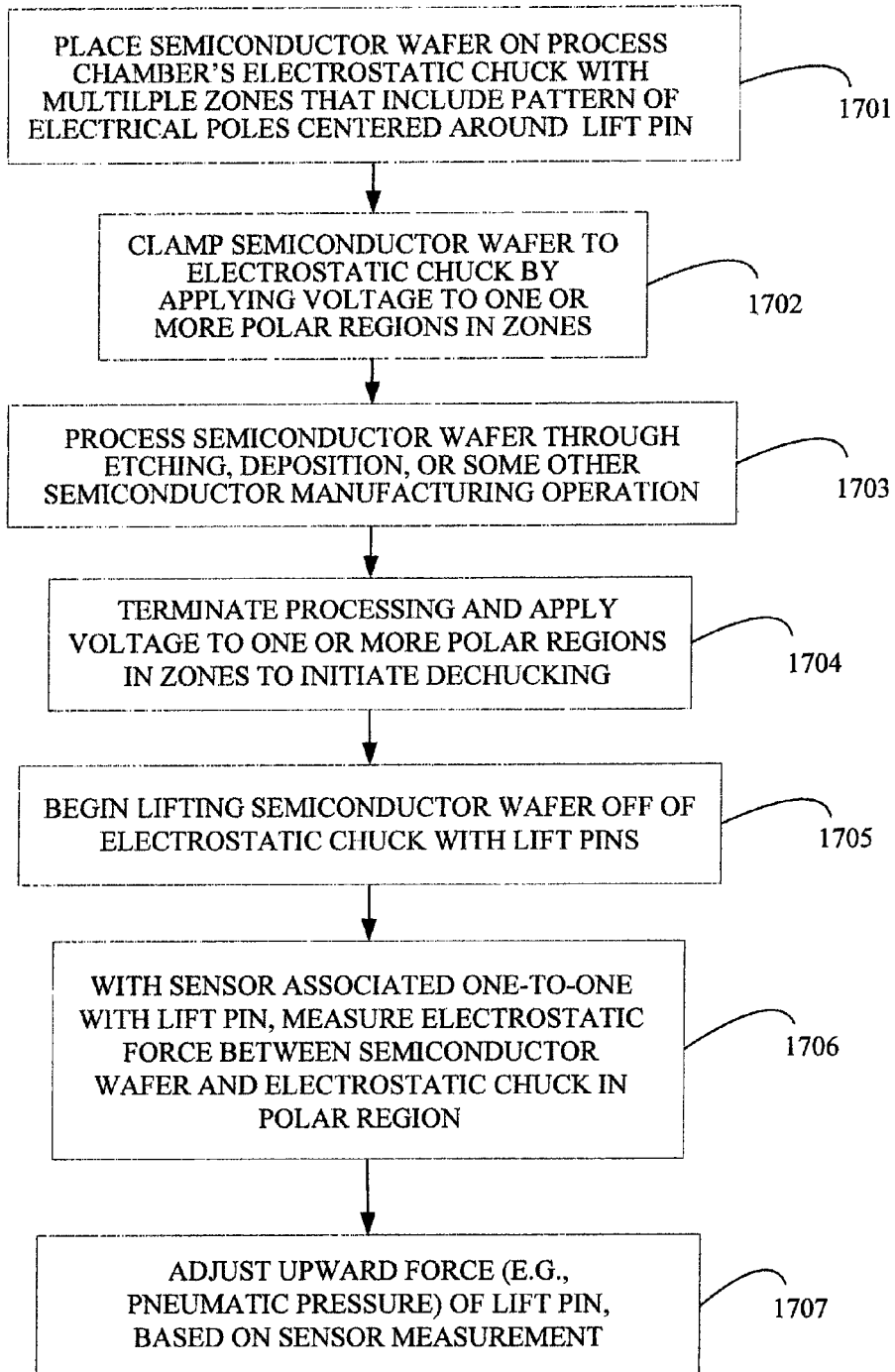
FIG. 17 is a flowchart diagram showing a process for processing a semiconductor wafer in a process chamber with an electrostatic chuck with a sensor associated one-to-one with a lift pin, in accordance with an example embodiment.

FIG. 17 is a flowchart diagram showing a process for processing a semiconductor wafer in a process chamber with an electrostatic chuck with a sensor associated one-to-one with a lift pin, in accordance with an example embodiment. The process is described from the point of view of a process controller, which in an example embodiment, might include an application program executing on an x86-processor platform with a Linux or Windows operating system.

In operation 1701 of the process, the process controller places a semiconductor wafer on a process chamber's electrostatic chuck with multiple zones, each of which includes a pattern of polar regions around a lift pin, as described above. In operation 1702, the process controller clamps the semiconductor wafer to the electrostatic chuck by applying voltage (e.g., direct current or DC) to one or more of the polar regions in the zones. Then in operation 1703, the process controller processes the semiconductor wafer through generating a plasma and using the plasma to etch the substrate, deposit a material on the substrate, or perform some other semiconductor manufacturing operation.

The process controller terminates the processing in operation 1704. In operation 1705, the process controller begins lifting the semiconductor wafer off of the electrostatic chuck with the lift pins. The process controller then measures, with a sensor associated one-to-one with a lift pin as described above, the electrostatic force between the semiconductor wafer and the electrostatic chuck, in operation 1706. In operation 1707, the process controller adjusts the upward force (e.g., pneumatic pressure) of the lift pin, based on the sensor's measurement.

Figure 18:
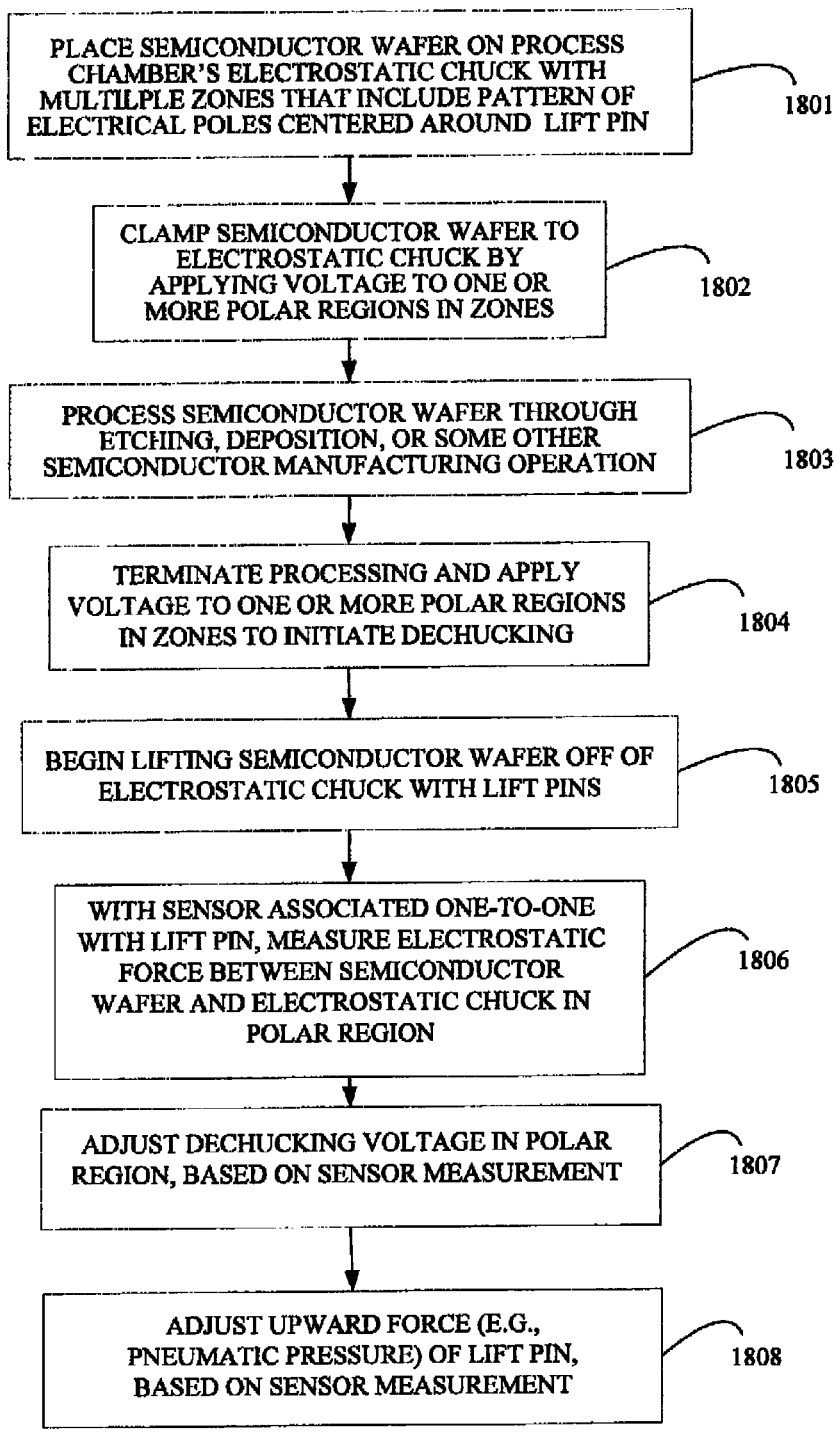
FIG. 18 is a flowchart diagram showing another process for processing a semiconductor wafer in a process chamber with an electrostatic chuck with a sensor associated one-to-one with a lift pin, in accordance with an example embodiment.

FIG. 18 is a flowchart diagram showing another process for processing a semiconductor wafer in a process chamber with an electrostatic chuck with a sensor associated one-to-one with a lift pin, in accordance with an example embodiment. In operation 1801 of the process, the process controller places a semiconductor wafer on a process chamber's electrostatic chuck with multiple zones, each of which includes a pattern of polar regions around a lifting pin. In operation 1802, the process controller clamps the semiconductor wafer to the electrostatic chuck by applying voltage (e.g., direct current or DC) to one or more of the polar regions in the zones. Then in operation 1803, the process controller processes the semiconductor wafer through generating a plasma and using the plasma to etch the substrate, deposit a material on the substrate, or perform some other semiconductor manufacturing operation.

The process controller terminates the processing and applies a voltage (e.g., direct current or DC) to one or more the polar regions to initiate dechucking, in operation 1804. It will be appreciated that this application of voltage did not occur in the process shown in FIG. 17. Then in operation 1805 of the process shown in FIG. 18, the process controller begins lifting the semiconductor wafer off of the electrostatic chuck with the lift pins. The process controller measures, with a sensor associated one-to-one with a lift pin as described above, the electrostatic force between the semiconductor wafer and the electrostatic chuck, in operation 1806. In operation 1807, the process controller adjusts the dechucking voltage in a polar region, based on the sensor's measurement. Then in operation 1808, the process controller adjusts the upward force (e.g., pneumatic pressure) of the lift pin, based on the sensor's measurement.

It will be appreciated that the process described in FIG. 18 uses both applied voltage (e.g., direct current or DC) and a sensor associated one-to-one with a lift pin to separate a semiconductor wafer from an electrostatic chuck. The application of the voltage can be varied from zone to zone, as can the upward force of the lift pin, to make "pinpoint" adjustments as to locations where electrostatic force might lead to damage to the semiconductor wafer by a lift pin.

In still another embodiment, the voltage applied (magnitude and time) to the one or more polar regions can be based on predefined formula. The formula can defined based on the processing expected to occur one the wafer. For instance, if a particular type of etch recipe is expected, predefined expected dechucking voltages and durations can be applied. In one embodiment, by arranging the conductive patterns on the chuck (i.e., defining polar regions) it is possible to better target dechucking at the point of lifting.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, such as the carrier network discussed above, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations.

The invention can also be embodied as computer readable code on a computer readable medium. The computer readable medium is any data storage device that can store data, which can thereafter be read by a computer system. Examples of the computer readable medium include hard drives, network attached storage (NAS), read-only memory, random-access memory, CD-ROMs, CD-Rs, CD-RWs, DVDs, Flash, magnetic tapes, and other optical and non-optical data storage devices. The computer readable medium can also be distributed over a network coupled computer systems so that the computer readable code is stored and executed in a distributed fashion.

Although the foregoing example embodiments have been described in some detail for purposes of clarity of understanding, it will be apparent that certain changes and modifications may be practiced within the scope of the appended claims. For example, the electrostatic chuck might be tripolar (e.g., a polar region might be associated with a magnitude in addition to being positive or negative) rather than bipolar or unipolar, in an alternative example embodiment. Accordingly, the example embodiments are to be considered as illustrative and not restrictive, and the invention is not to be limited to the details given herein, but may be modified within the scope and equivalents of the appended claims.

What is claimed is:

1. An apparatus for electrostatic chucking and dechucking, comprising:
   an electrostatic chuck with a plurality of zones and a plurality of lift pins, wherein each zone includes one or more polar regions which are electrically polar around one of said lift pins for contacting a bottom surface of a substrate, wherein the lift pin is associated one-to-one with a sensor;
   one or more lift-pin controllers that control the lift pins;
   one or more polar-region controllers that control the polar regions; and
   a process controller that includes an application program that controls the one or more lift-pin controllers and the one or more polar-region controllers in order to make variations from zone to zone based on sensor measurements, wherein the variations include one or both of applied voltage to the polar regions or upward force of the lift pins.

2. An apparatus as in claim 1, wherein the lift pin further comprises a pneumatic cylinder.

3. An apparatus as in claim 1, wherein the sensor provides feedback to the one or more lift-pin controllers.

4. An apparatus as in claim 1, wherein one polar-region controller is connected to all the polar regions.

5. An apparatus as in claim 4, wherein the sensor provides feedback to the polar-region controller.

6. An apparatus as in claim 1, wherein a separate polar-region controller is connected to each polar region.

7. An apparatus as in claim 6, wherein the sensor provides feedback to each polar-region controller.

8. An apparatus as in claim 1, further comprising a sensor pin.

9. An apparatus as in claim 8, wherein the sensor pin provides feedback to the one or more lift-pin controllers.

10. An apparatus as in claim 9, wherein one polar-region controller is connected to all polar regions.

11. An apparatus as in claim 10, wherein the sensor pin provides feedback to the polar-region controller.

12. An apparatus as in claim 9, wherein a separate polar-region controller is connected to each polar region.

13. An apparatus as in claim 12, wherein the sensor pin provides feedback to each polar-region controller.

14. A chamber for processing a semiconductor wafer, the chamber comprising:
   an electrostatic chuck defined to support a substrate, the electrostatic chuck having a plurality of bores for receiving a plurality of lift pins for engaging the substrate when present, wherein each of the lift pins is associated one-to-one with a sensor, the electrostatic chuck including a plurality of polar regions that are electrically polar and that are defined to at least partially surround each of the plurality of bores, and
   a process controller that includes an application program that controls the one or more lift-pin controllers that control the lift pins and the one or more polar-region controllers that control the polar regions in order to make variations from zone to zone based on sensor measurements, wherein the variations include one or both of applied voltage to the polar regions or upward force of the lift pins.

15. The chamber of claim 14, wherein each of the plurality of polar regions has a geometric pattern and a voltage supply coupled to the geometric pattern.

16. The chamber of claim 14, wherein each of the plurality of polar regions is coupled to a same voltage.

17. The chamber of claim 14, wherein each of the plurality of polar regions is coupled to a different voltage.

18. The chamber of claim 14, wherein each of the plurality of polar regions defines a zone, and each zone is coupled to a voltage supply.

19. The chamber of claim 14, wherein the electrostatic chuck includes,
   a metallic base;
   a dielectric layer disposed over the metallic base, the dielectric layer defining a surface for the support of the substrate;
   the geometric patterns defined from a conductive metal disposed in the dielectric layer; and
   circuitry for applying voltage to the conductive material, wherein the circuitry is disposed in the dielectric layer.

20. The chamber of claim 19, wherein the bores are defined through the metallic base and the dielectric layer.

* * * * *